(12) United States Patent
Choi et al.

(10) Patent No.: US 9,793,381 B2
(45) Date of Patent: Oct. 17, 2017

(54) METHOD FOR MANUFACTURING A SEMICONDUCTOR DEVICE

(71) Applicant: Samsung Electronics Co., Ltd., Suwon-si, Gyeonggi-do (KR)

(72) Inventors: Kyungin Choi, Seoul (KR); Dongwoo Kim, Incheon (KR); Chang Woo Sohn, Hwaseong-si (KR); Youngmoon Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/131,611

(22) Filed: Apr. 18, 2016

(65) Prior Publication Data

US 2016/0359020 A1 Dec. 8, 2016

(30) Foreign Application Priority Data

Jun. 4, 2015 (KR) .......................... 10-2015-0079338

(51) Int. Cl.
| | |
|---|---|
| *H01L 29/66* | (2006.01) |
| *H01L 29/161* | (2006.01) |
| *H01L 29/165* | (2006.01) |
| *H01L 29/78* | (2006.01) |
| *H01L 21/3065* | (2006.01) |

(52) U.S. Cl.
CPC .... *H01L 29/66795* (2013.01); *H01L 21/3065* (2013.01); *H01L 29/161* (2013.01); *H01L 29/165* (2013.01); *H01L 29/66545* (2013.01); *H01L 29/7848* (2013.01)

(58) Field of Classification Search
CPC .. H01L 21/3065; H01L 29/161; H01L 29/165
See application file for complete search history.

(56) References Cited

U.S. PATENT DOCUMENTS

| | | | |
|---|---|---|---|
| 7,214,576 B1 | 5/2007 | Kaneko et al. | |
| 7,667,271 B2 * | 2/2010 | Yu ..................... | H01L 21/26586 257/347 |
| 7,872,303 B2 | 1/2011 | Chan et al. | |

(Continued)

FOREIGN PATENT DOCUMENTS

| | | |
|---|---|---|
| JP | 2007-073831 A | 3/2007 |
| KR | 2011-0049709 A | 5/2011 |

(Continued)

*Primary Examiner* — Caridad Everhart
*Assistant Examiner* — Ankush Singal
(74) *Attorney, Agent, or Firm* — Harness, Dickey & Pierce, P.L.C.

(57) ABSTRACT

A method for manufacturing a semiconductor device includes forming a fin structure extending in a first direction on a substrate, forming a sacrificial gate pattern extending in a second direction to intersect the fin structure, forming a gate spacer layer covering the fin structure and the sacrificial gate pattern, providing a first ion beam having a first incident angle range and a second ion beam having a second incident angle range to the substrate, patterning the gate spacer layer using the first ion beam and the second ion beam to form gate spacers on sidewalls of the sacrificial gate pattern, forming source/drain regions at both sides of the sacrificial gate patterns, and replacing the sacrificial gate pattern with a gate electrode.

20 Claims, 21 Drawing Sheets

(56) References Cited

U.S. PATENT DOCUMENTS

| | | | |
|---|---|---|---|
| 8,124,507 B2* | 2/2012 | Sasaki | H01L 29/66795 257/E21.143 |
| 8,163,610 B2 | 4/2012 | Aritome | |
| 8,486,769 B2 | 7/2013 | Wang et al. | |
| 8,518,767 B2 | 8/2013 | Cheng et al. | |
| 8,518,786 B2 | 8/2013 | Wang | |
| 8,633,076 B2 | 1/2014 | Wang et al. | |
| 8,716,797 B2 | 5/2014 | Basker et al. | |
| 8,796,093 B1 | 8/2014 | Cheng et al. | |
| 8,815,691 B2 | 8/2014 | Colinge et al. | |
| 9,153,696 B2* | 10/2015 | An | H01L 29/7856 |
| 9,287,181 B2* | 3/2016 | Tseng | H01L 21/823857 |
| 9,466,724 B2* | 10/2016 | Yang | H01L 29/7853 |
| 2004/0099818 A1* | 5/2004 | Jun | H01J 37/3171 250/492.21 |
| 2005/0202618 A1* | 9/2005 | Yagishita | H01L 21/84 438/197 |
| 2008/0203468 A1 | 8/2008 | Cheng et al. | |
| 2010/0038679 A1 | 2/2010 | Chan et al. | |
| 2011/0101455 A1 | 5/2011 | Basker et al. | |
| 2011/0227162 A1 | 9/2011 | Lin et al. | |
| 2011/0230033 A1 | 9/2011 | Aritome | |
| 2012/0126325 A1 | 5/2012 | Wang et al. | |
| 2012/0126375 A1 | 5/2012 | Wang et al. | |
| 2013/0130461 A1 | 5/2013 | Wang | |
| 2013/0249003 A1* | 9/2013 | Oh | H01L 21/845 257/347 |
| 2014/0167264 A1 | 6/2014 | Besser et al. | |
| 2014/0175561 A1 | 6/2014 | Colinge et al. | |
| 2014/0217517 A1 | 8/2014 | Cai et al. | |
| 2014/0252489 A1 | 9/2014 | Yu et al. | |
| 2015/0132909 A1* | 5/2015 | Choi | H01L 29/66803 438/283 |
| 2015/0243755 A1* | 8/2015 | Cheng | H01L 21/3086 257/288 |
| 2015/0287711 A1* | 10/2015 | Kim | H01L 27/0207 257/344 |
| 2016/0064379 A1* | 3/2016 | Yu | H01L 21/0223 257/192 |
| 2016/0093726 A1* | 3/2016 | Ching | H01L 29/785 257/192 |

FOREIGN PATENT DOCUMENTS

| | | |
|---|---|---|
| KR | 10-1154915 B1 | 6/2012 |
| KR | 2014-0111575 A | 9/2014 |
| KR | 2014-0143841 A | 12/2014 |

* cited by examiner

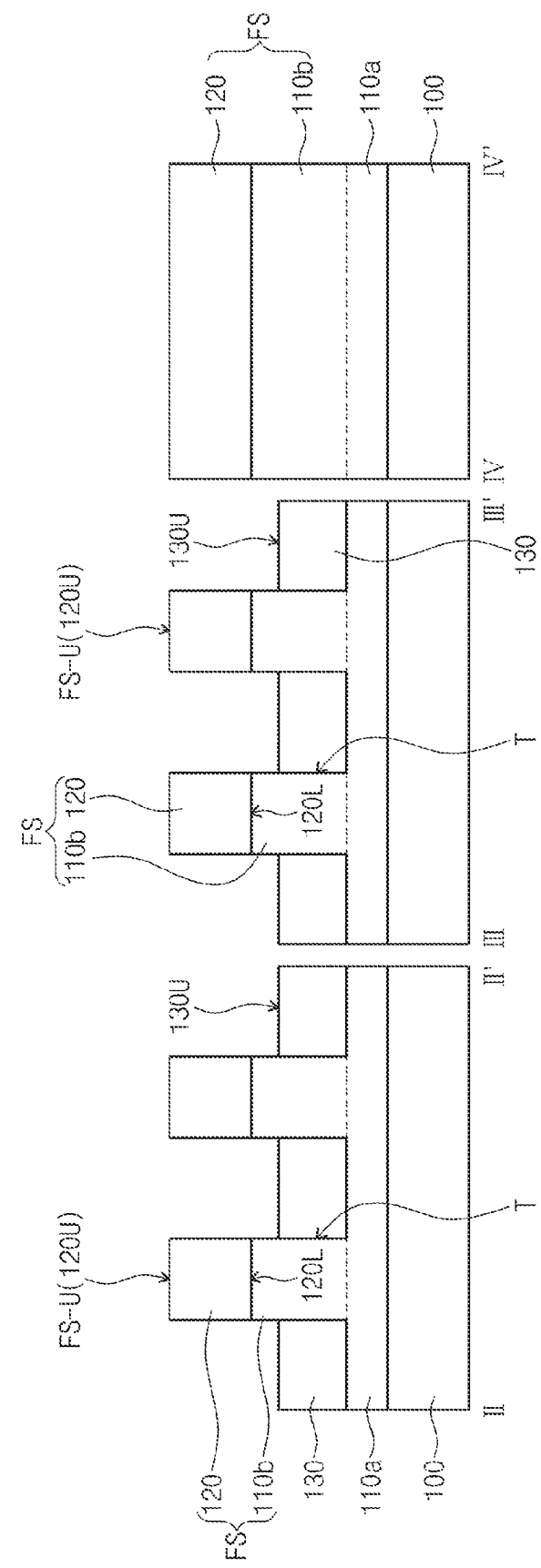

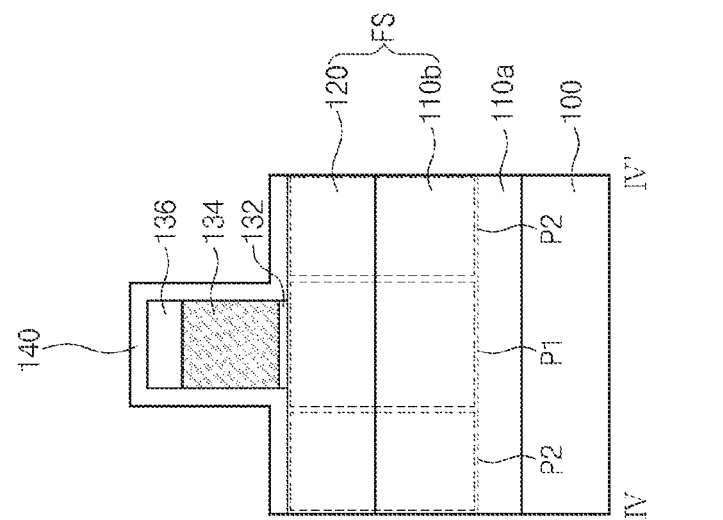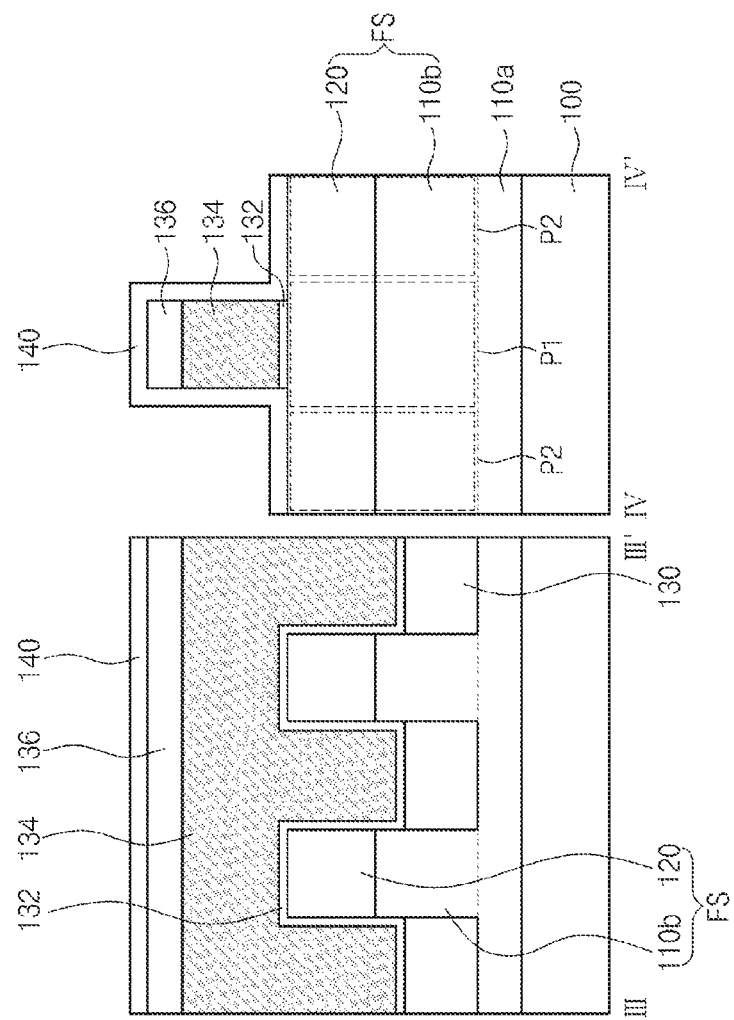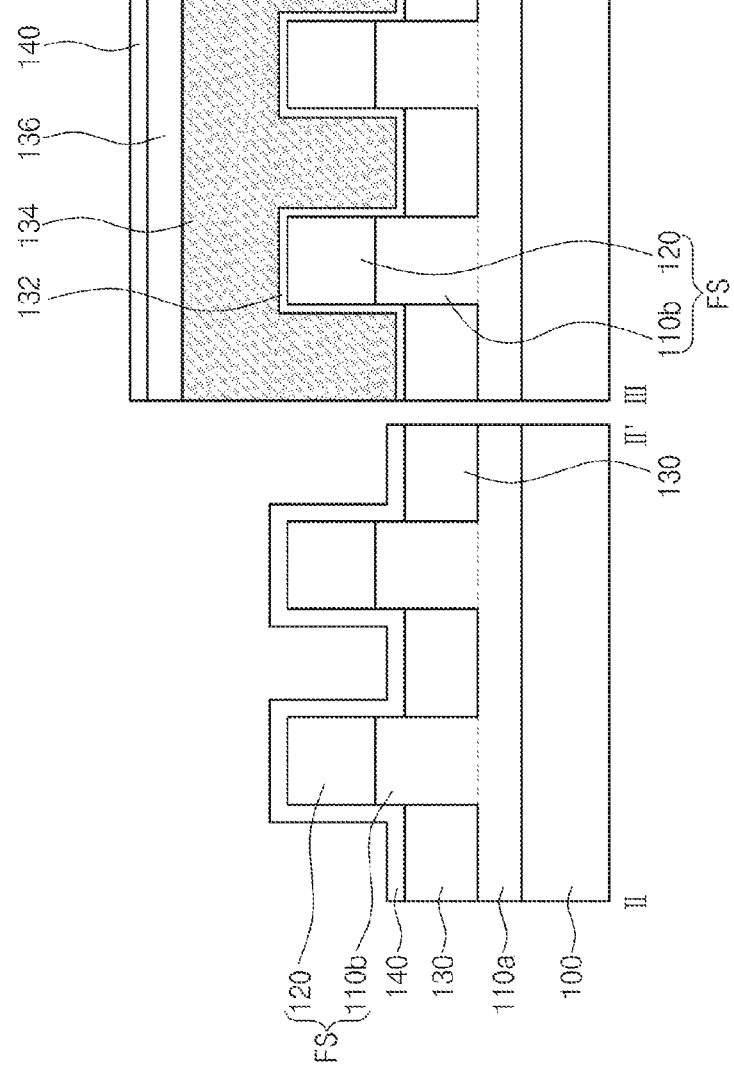

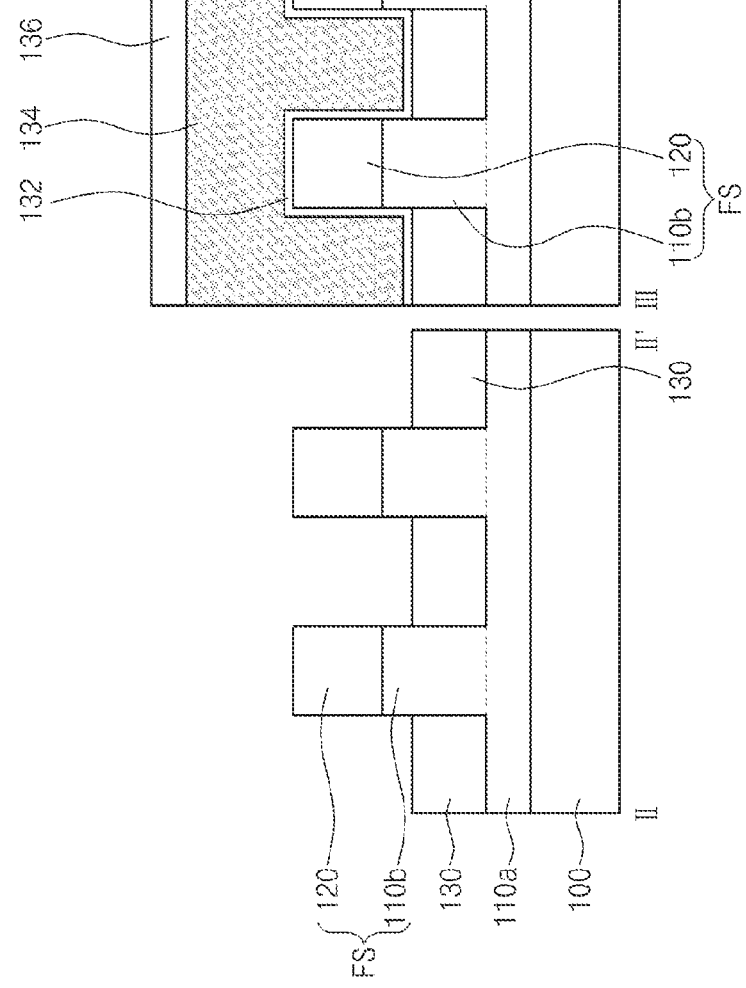

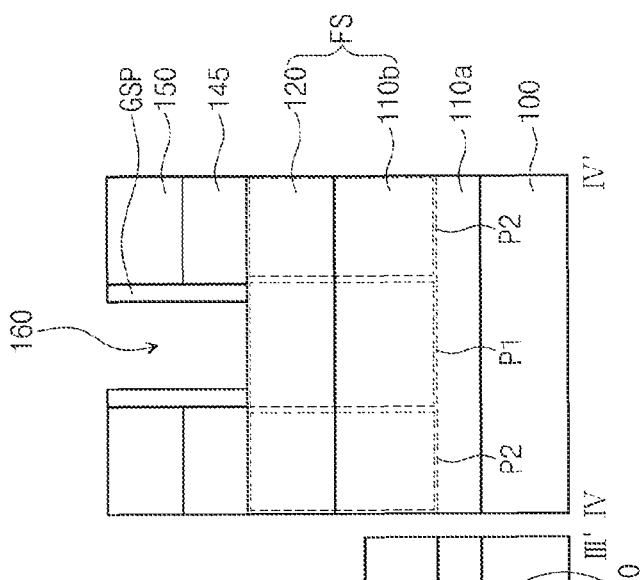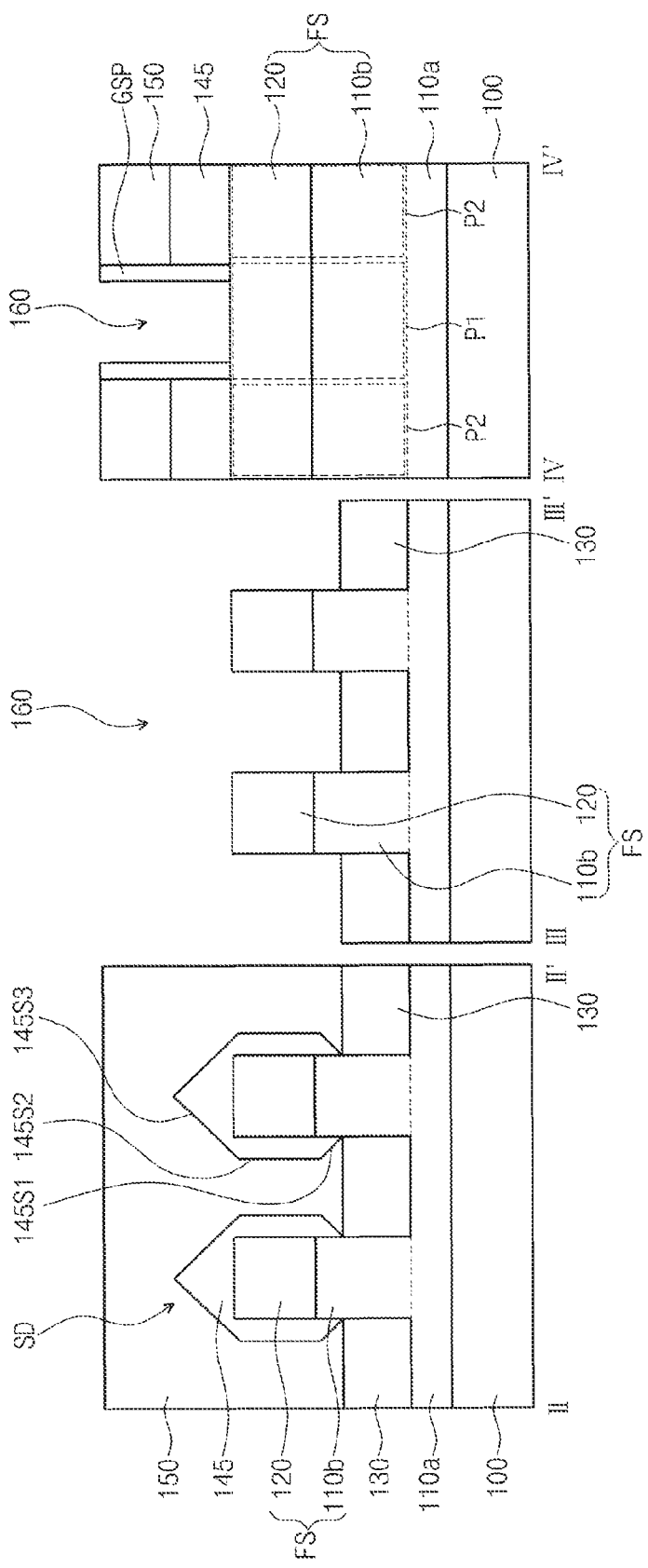

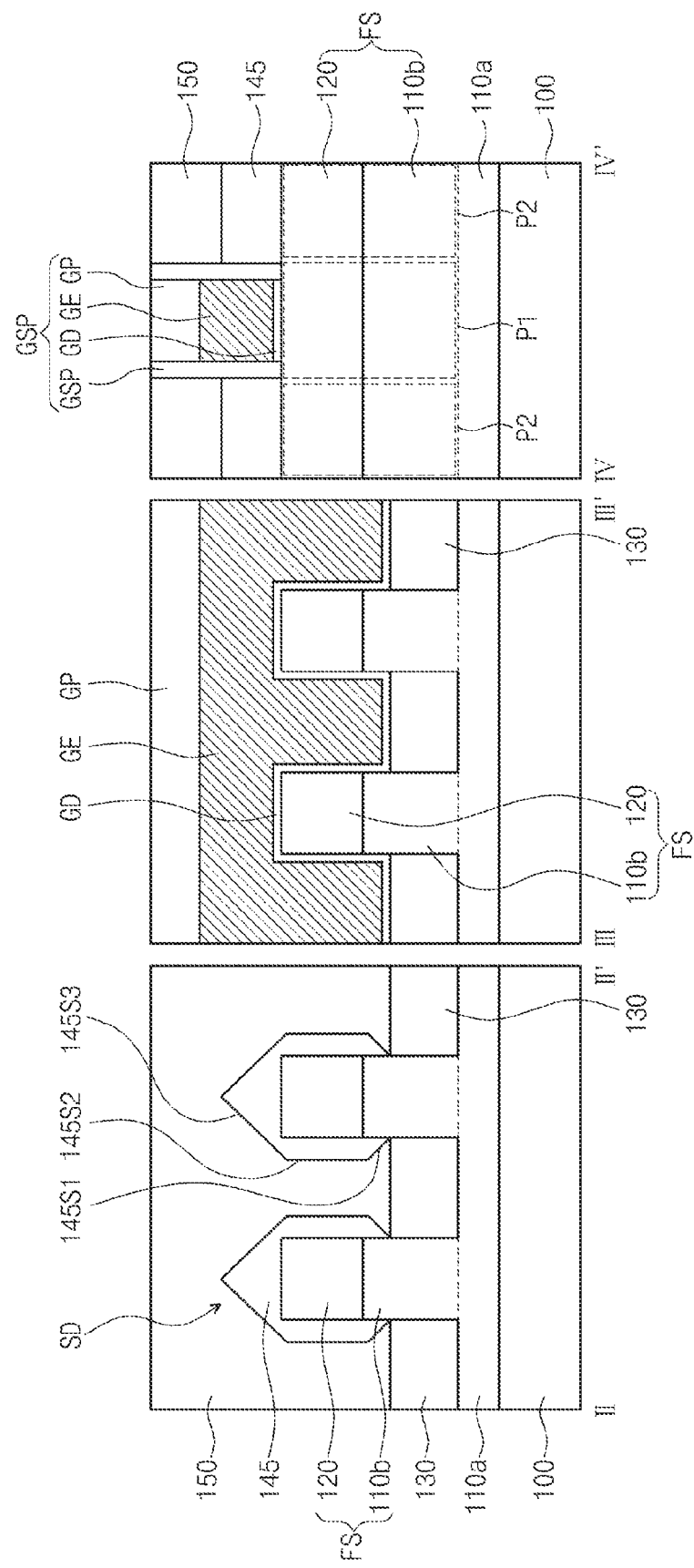

METHOD FOR MANUFACTURING A SEMICONDUCTOR DEVICE

CROSS-REFERENCE TO RELATED APPLICATION

This U.S. non-provisional patent application claims priority under 35 U.S.C. §119 to Korean Patent Application No. 10-2015-0079338, filed on Jun. 4, 2015, in the Korean Intellectual Property Office, the disclosure of which is hereby incorporated by reference in its entirety.

BACKGROUND

The present disclosure relates to methods for manufacturing a semiconductor device and, more particularly, to methods for manufacturing a semiconductor device including a fin field effect transistor.

A semiconductor device may include an integrated circuit including metal-oxide-semiconductor field effect transistors (MOSFETs). As sizes and design rules of semiconductor devices have been reduced, sizes of MOSFETs have also been scaled down. Operating characteristics of semiconductor devices may be deteriorated by the scale down of the MOSFETs. Thus, various research is being conducted for semiconductor devices capable of overcoming limitations caused by a high integration density and of improving performance.

SUMMARY

Example embodiments of inventive concepts may provide methods for manufacturing a semiconductor device with improved electrical characteristics.

Example embodiments of inventive concepts may also provide methods for manufacturing a semiconductor device capable of increasing a process margin of a process of forming a cladding layer.

According to example embodiments of inventive concepts, a method for manufacturing a semiconductor device may include forming a fin structure on a substrate, forming a sacrificial gate pattern on the substrate, forming a gate spacer covering the fin structure and the sacrificial gate pattern, providing a first ion beam having a first incident angle range and a second ion beam having a second incident angle range to the substrate, patterning the gate spacer layer using the first ion beam and the second ion beam to form gate spacers on sidewalls of the sacrificial gate pattern, forming source/drain regions at both sides of the sacrificial gate patterns, and replacing the sacrificial gate pattern with a gate electrode. The fin structure extends in a first direction on the substrate. The sacrificial gate pattern extends in a second direction intersecting the first direction. The sacrificial gate pattern intersects the fin structure. The first and second ion beams are irradiated at a same time. An irradiation direction of the first ion beam and an irradiation direction of the second ion beam may be tilted from a normal line perpendicular to a top surface of the substrate. The irradiation direction of the first ion beam may include a vector component in the second direction. The irradiation direction of the second ion beam may include a vector component in a direction opposite to the second direction when viewed from a plan view.

In example embodiments, each of the first and second incident angle ranges may be from 10 degrees to 50 degrees, and the first and second incident angle ranges may be defined as angle ranges tilted from the normal line.

In example embodiments, the first incident angle range may be substantially equal to the second incident angle range.

In example embodiments, the providing the first ion beam and the second ion beam may include supplying a source gas over the substrate, converting the source gas into a plasma using plasma power, and applying an ion extraction voltage to the substrate to extract the first ion beam and the second ion beam from the plasma.

In example embodiments, the source gas may include a mixed gas of a fluorine-based etching gas and an oxygen gas.

In example embodiments, the fluorine-based etching gas may include at least one of $CH_3F$, $CF_4$, $C_2F_6$, $SiF_4$, or $NF_3$.

In example embodiments, a partial pressure ratio of the oxygen gas in the source gas may range from 50% to 80%.

In example embodiments, the applying the ion extraction voltage may include applying the ion extraction voltage in a pulse form, and a duty cycle of the ion extraction voltage may range from 50% to 75%.

In example embodiments, the ion extraction voltage may range from 200V to 1000V.

In example embodiments, the fin structure may include a buffer pattern and an active pattern, and the buffer pattern may provide a tensile or compressive strain to the active pattern.

In example embodiments, the fin structure may include a first portion under the sacrificial gate pattern, and second portions at both sides of the sacrificial gate pattern. The gate spacer layer may cover top surfaces and sidewalls of the second portions. Patterning the gate spacer layer may include fully removing the gate spacer layer on the top surfaces and the sidewalls of the second portions by means of the first ion beam and the second ion beam. The sidewalls of each of the second portions may be opposite to each other in the second direction.

In example embodiments, the forming the source/drain regions may include performing an epitaxial process to form cladding layers on the second portions. Each of the cladding layers may include a first sidewall negatively inclined to the top surface of the substrate, a second sidewall positively inclined to the top surface of the substrate, and a third sidewall connected to the first and second sidewalls. One end of the third sidewall adjacent to the substrate may be connected to one end of the first sidewall, and another end of the third sidewall may be connected to one end of the second sidewall.

In example embodiments, the third sidewall may be substantially perpendicular to the top surface of the substrate.

In example embodiments, the forming the source/drain regions may further include doping portions of the second portions with dopants before cladding layers are formed.

According to example embodiments of inventive concepts, a method for manufacturing a semiconductor device may include forming a fin structure on a substrate, forming a sacrificial gate pattern intersecting the fin structure, forming a gate spacer layer on the substrate including the sacrificial gate pattern, etching the gate spacer layer using an ion beam etching process to form gate spacers on sidewalls of the sacrificial gate pattern, forming cladding layers on the fin structure at both sides of the sacrificial gate pattern, and replacing the sacrificial gate pattern with a gate electrode. The ion beam etching process may be performed using an ion beam having a desired (and/or alternatively predetermined) incident angle range, and the ion beam may be tilted from a normal line perpendicular to a top surface of the substrate. The ion beam may be irradiated in substantially parallel to a plane defined by a direction intersecting the fin structure and a direction perpendicular to the top surface of the substrate.

In example embodiments, the ion beam may include a first ion beam having a first incident angle range and a second ion beam having a second incident angle range. The first ion beam and the second ion beam may be symmetrical with respect to the normal line.

In example embodiments, each of the first and second incident angle ranges may be from 10 degrees to 50 degrees, and the first and second incident angle ranges may be defined as angle ranges tilted from the normal line.

In example embodiments, each of the cladding layers may include a first sidewall negatively inclined to the top surface of the substrate, a second sidewall positively inclined to the top surface of the substrate, and a third sidewall connected to the first and second sidewalls. A length of the third sidewall may be greater than those of the first and second sidewalls.

In example embodiments, the method may further include doping portions of the fin structure at both sides of the sacrificial gate pattern with dopants before forming the cladding layers.

According to example embodiments of inventive concepts, a method for manufacturing a semiconductor device may include forming a buffer layer having a different lattice constant from a substrate on the substrate, forming a fin structure protruding from the buffer layer and extending in a first direction, forming device isolation layers exposing an upper portion of the fin structure on the substrate, forming a sacrificial gate pattern extending in a second direction intersecting the first direction to intersect the fin structure, forming a gate spacer layer on the substrate having the sacrificial gate pattern, etching the gate spacer layer by an ion beam etching process to form gate spacers on sidewalls of the sacrificial gate pattern, doping portions of the fin structure disposed at both sides of the sacrificial gate pattern with dopants, forming cladding layers on the fin structure at both sides of the sacrificial gate pattern, and replacing the sacrificial gate pattern with a gate electrode. The ion beam etching process may be performed using a first ion beam having a first incident angle range and a second ion beam having a second incident angle range. Irradiation directions of the first and second ion beams may be tilted from a normal line perpendicular to a top surface of the substrate. The irradiation direction of the first ion beam may have a vector component in the second direction and the irradiation direction of the second ion beam may have a vector component in a direction opposite to the second direction when viewed from a plan view.

According to example embodiments, a method for manufacturing a semiconductor device includes forming a gate spacer layer covering a fin structure and a sacrificial gate pattern on a substrate, forming gate spacers on sidewalls of the sacrificial gate pattern by patterning the gate spacer layer using an ion beam etching process, and replacing the sacrificial gate pattern with a gate electrode. The fin structure extends in a first direction. The sacrificial gate pattern extends in a second direction crossing the first direction. The sacrificial gate pattern crosses over the fin structure. The ion beam etching process includes supplying a source gas over the substrate, converting the source gas into a plasma, applying an ion extraction voltage to the substrate to extract a first ion beam and a second ion beam from the plasma, and directing irradiation directions of the first ion beam and the second ion beam. The directing the irradiation directions of the first ion beam and the second ion beam includes directing the first ion beam and the second ion beam so the first ion beam and the second ion beam along the first direction are directed normal to the substrate. The directing the irradiation directions of the first ion beam and the second ion beam includes directing the first ion beam and the second ion beam such that the first ion beam and the second ion beam along the second direction are directed tilted towards the substrate and are tilted towards each other in respective directions that are tilted from a normal line perpendicular to a top surface of the substrate.

In example embodiments, the source gas may include a mixed gas of a fluorine-based etching gas and an oxygen gas.

In example embodiments, the directing the irradiation directions of the first ion beam and the second ion beam may include tilting the first ion beam and the second ion beam along the second direction so the first ion beam and the second ion beam each include an incident angle range from 10 degrees to 50 degrees and the first ion beam and the second ion beam are symmetrical with respect to the normal line.

In example embodiments, the method may further include forming source/drain regions at both sides of the sacrificial gate patterns.

In example embodiments, the directing irradiation directions of the first ion beam and the second ion beam may include directing the first ion beam and the second ion beam through an ion beam control unit over the substrate. The ion beam control unit may include first and second insulators laterally spaced apart from each other in the first direction and a third insulator at a higher level than the first and second insulators and between the first and second insulators in a plan view. The first to third insulators may each extend in the second direction.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

FIGS. 2A to 2F, 3A to 3F, and 4A to 4F are cross-sectional views taken along lines II-II', III-III', and IV-IV' of FIGS. 1A to 1F, respectively.

DETAILED DESCRIPTION OF EXAMPLE EMBODIMENTS

Figure 1A:
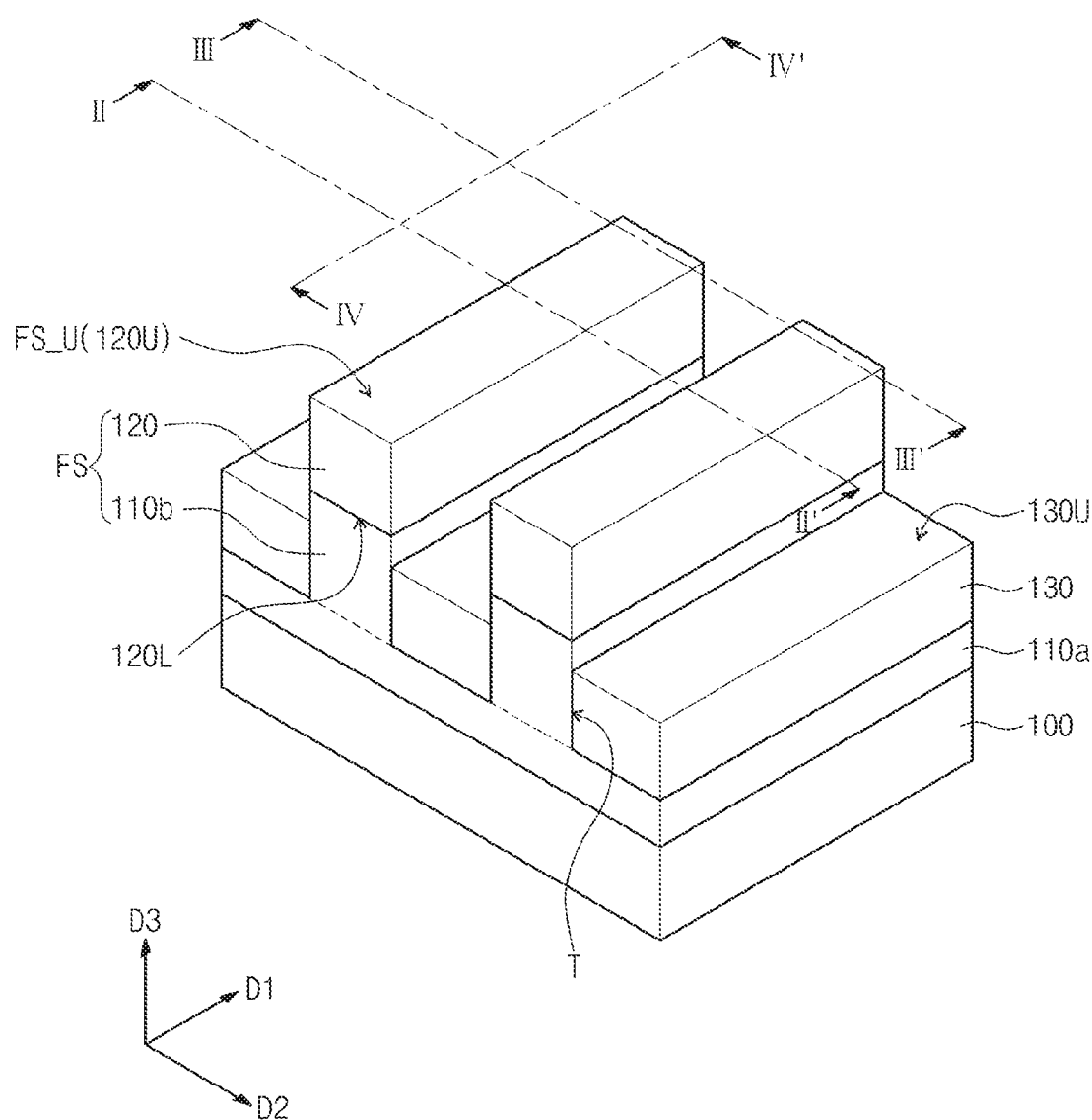
FIGS. 1A to 1F are perspective views illustrating a method for manufacturing a semiconductor device according to example embodiments of inventive concepts.
Figure 1B:
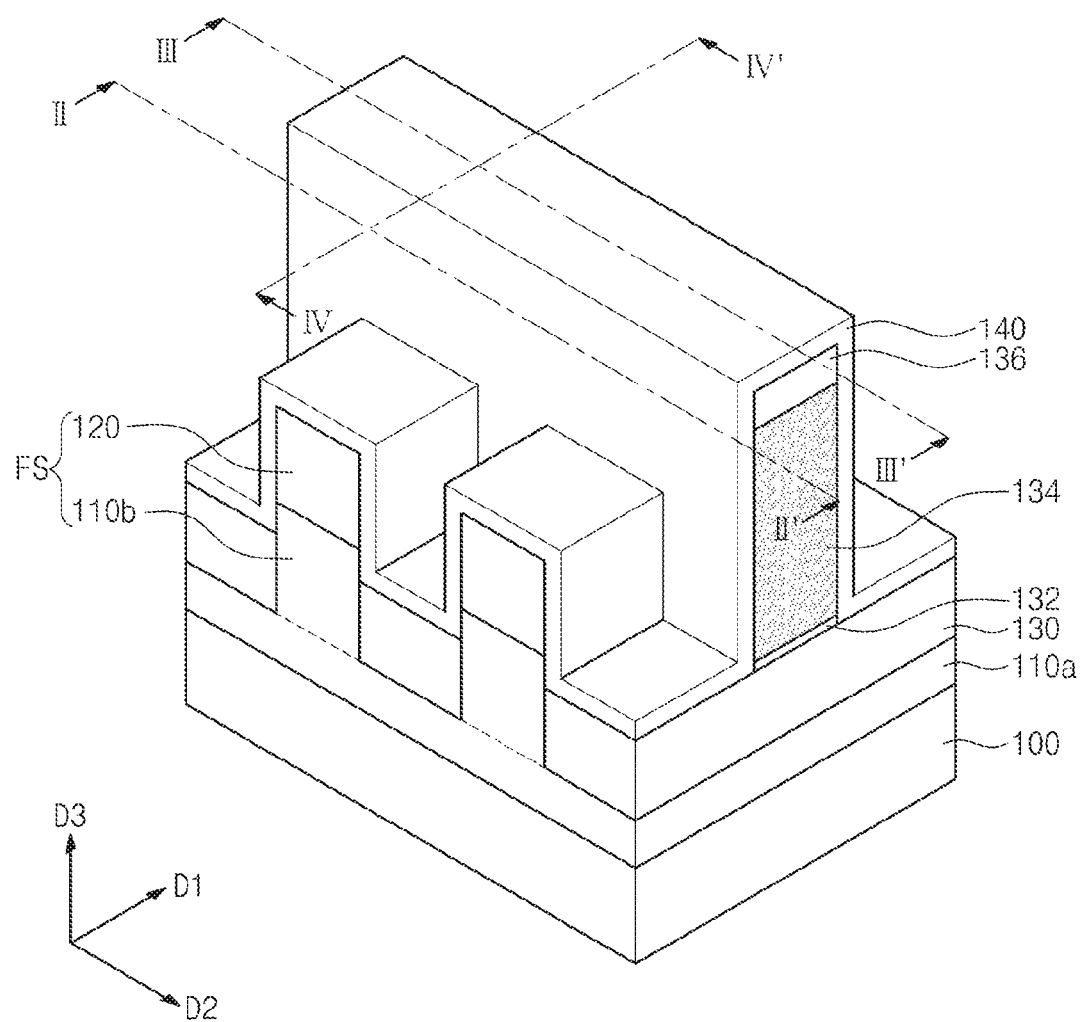
Figure 1C:
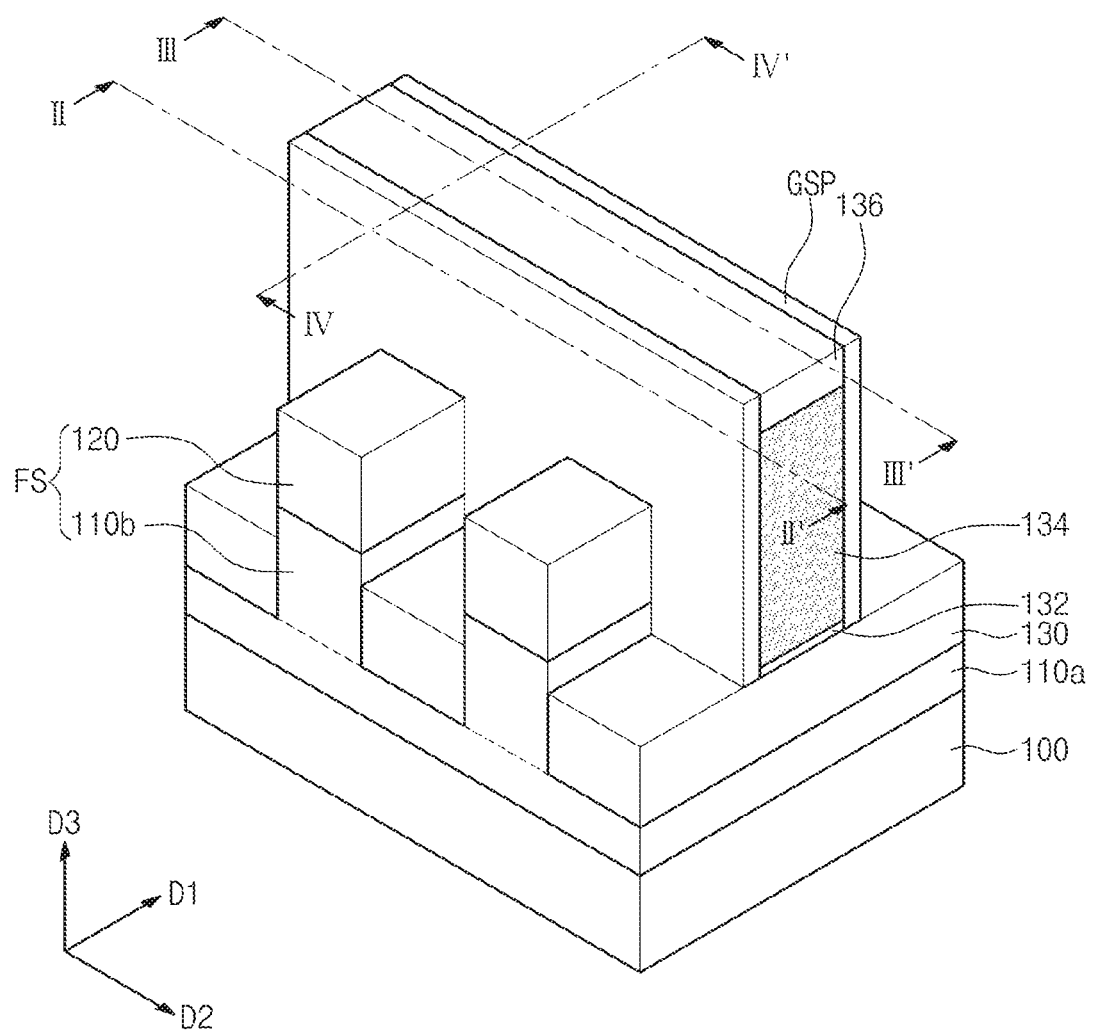
Figure 1D:
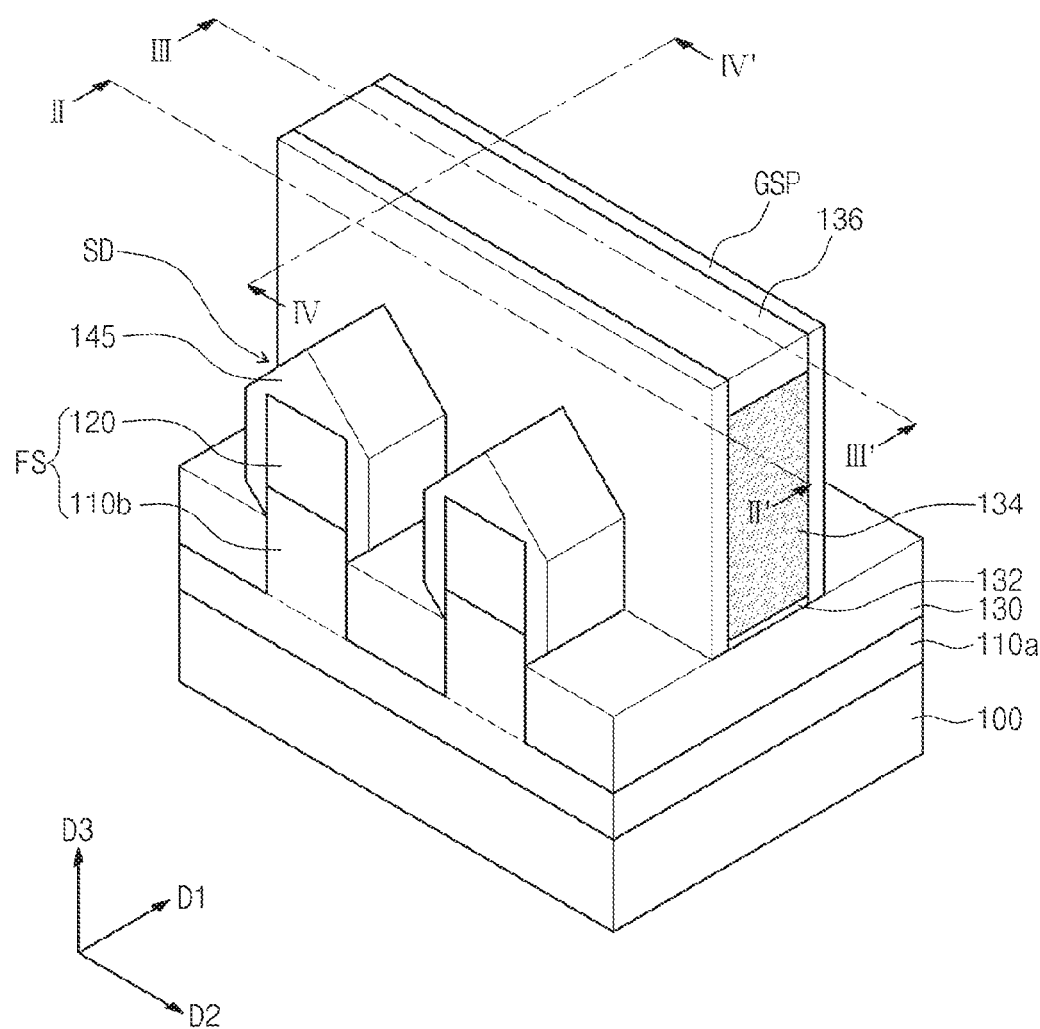
Figure 1E:
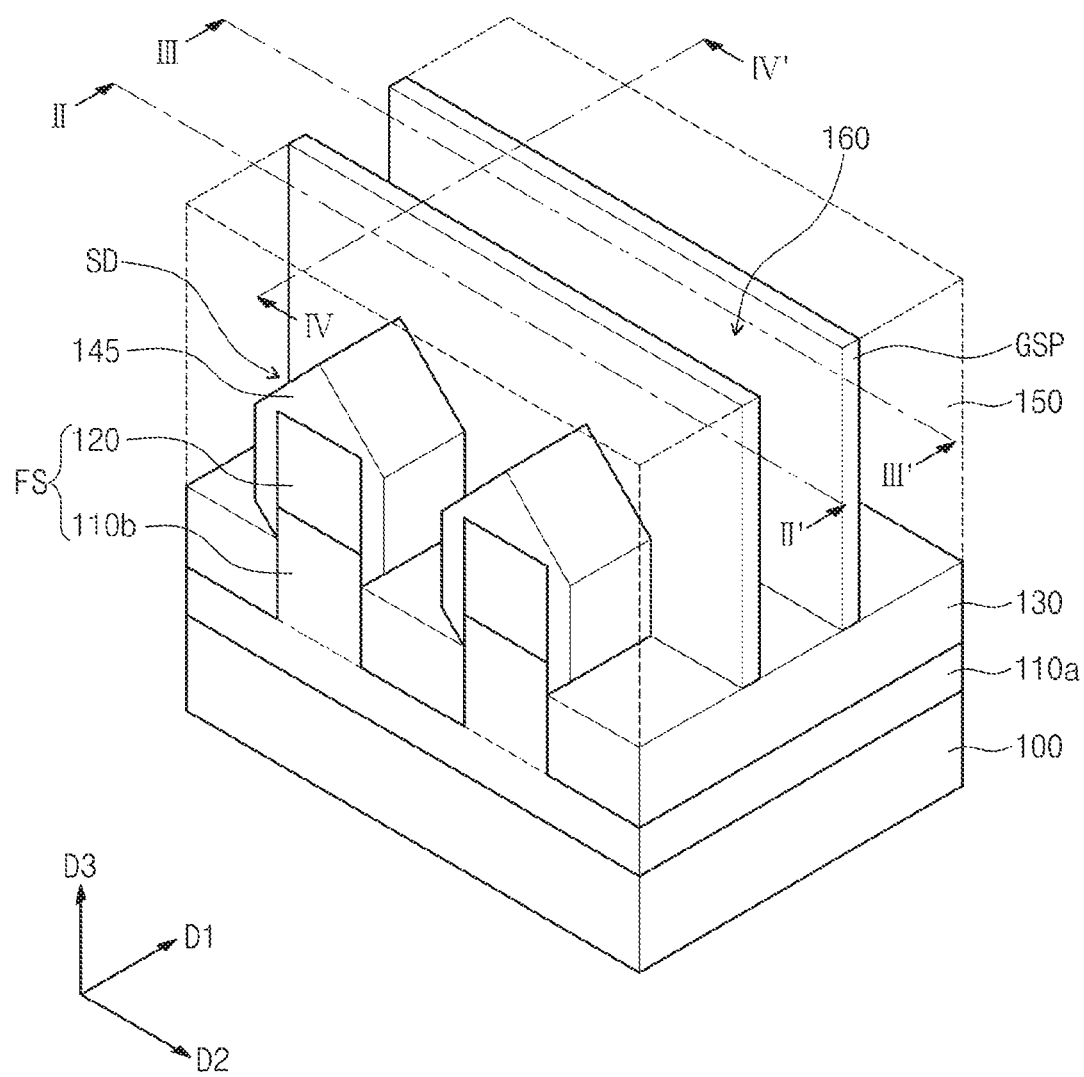
Figure 1F:
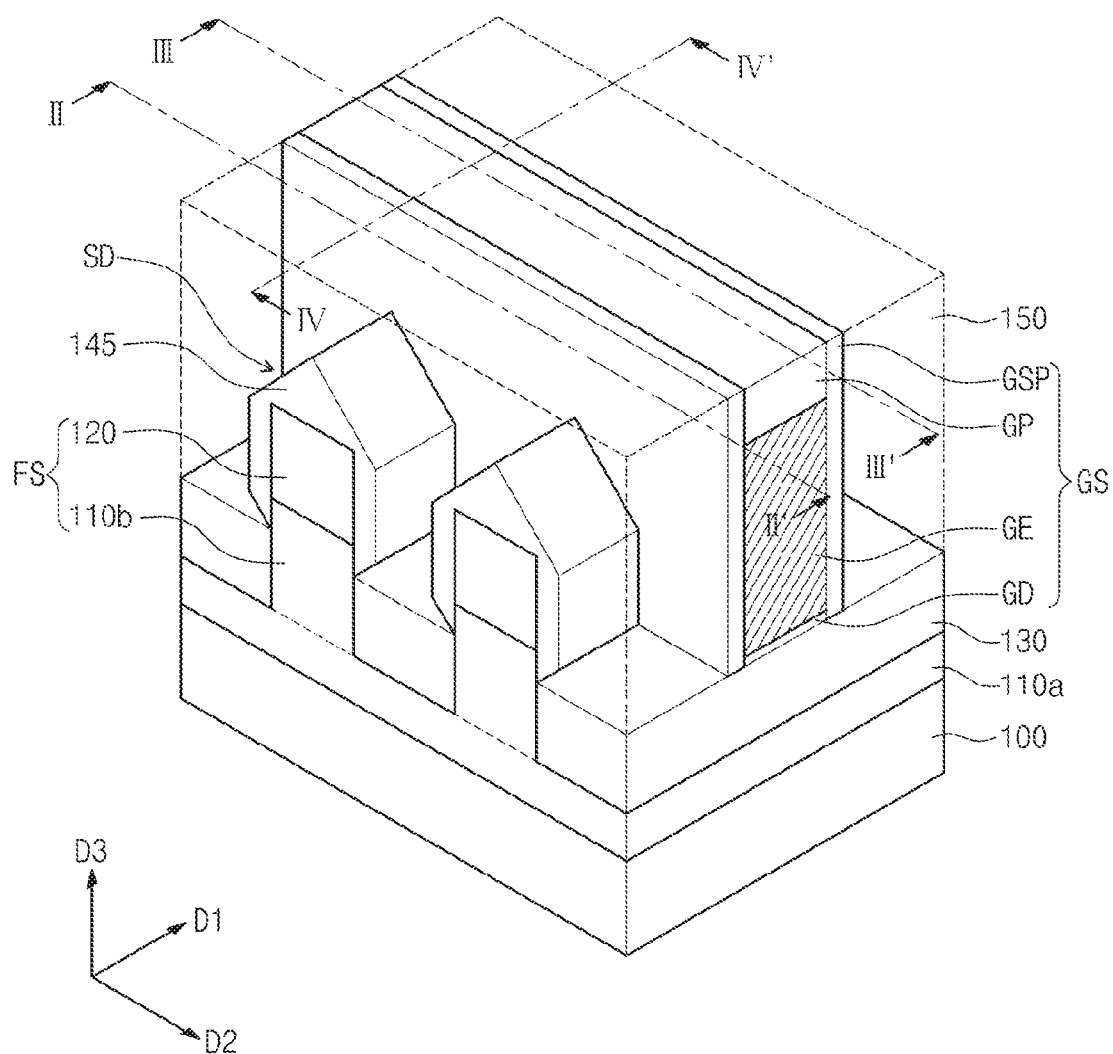
Figures 2D, 3D, 4D:
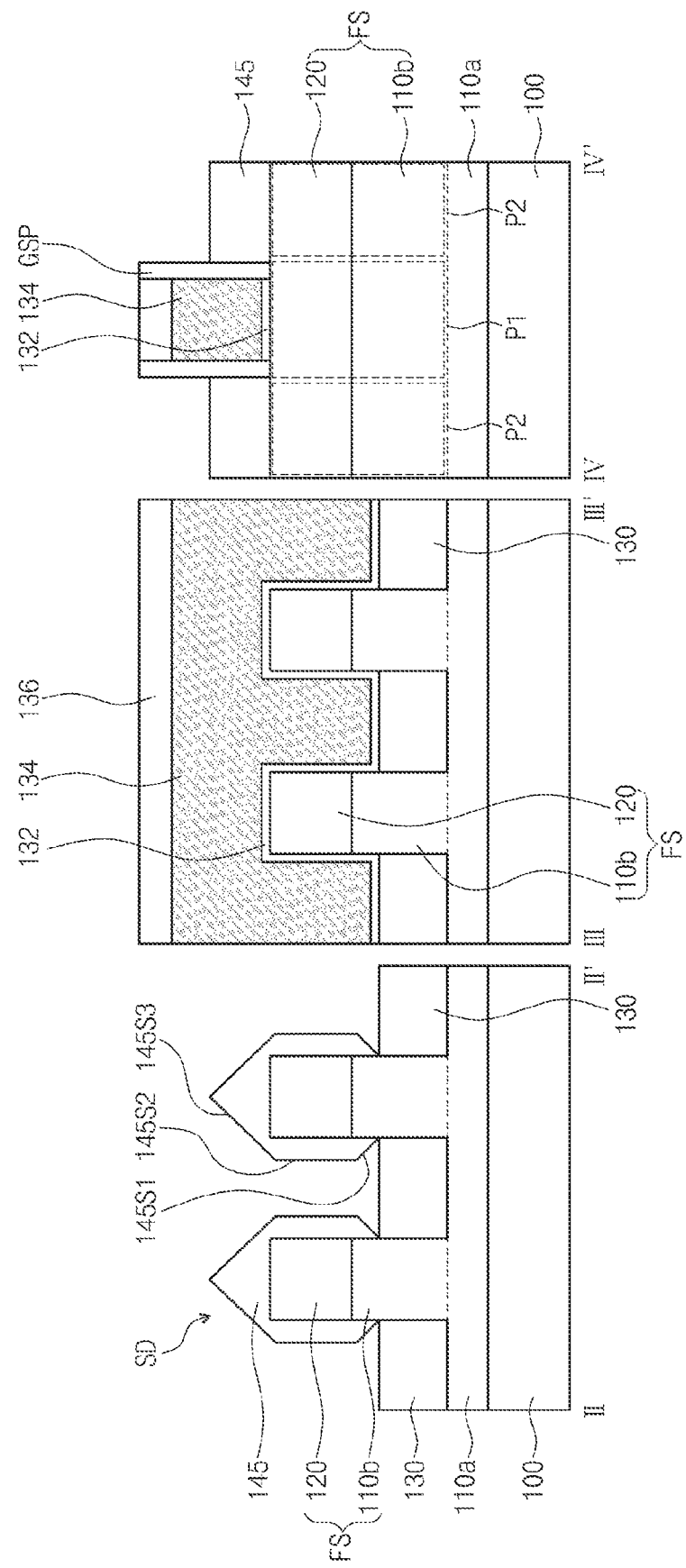

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. Additionally, in the drawings, the thicknesses of elements are exaggerated for clarity. Like reference numerals or the same reference designators denote like elements throughout the specification. As used herein, the term "and/or" includes any and all combinations of one or more of the associated listed items.

In the specification, it will be understood that when an element such as a layer, region or substrate is referred to as being "on" another element, it can be directly on the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments. It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limiting of example embodiments. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, example embodiments of inventive concepts will be fully described with reference to the accompanying drawings.

FIGS. 1A to 1F are perspective views illustrating a method for manufacturing a semiconductor device according to example embodiments of inventive concepts. FIGS. 2A to 2F, 3A to 3F, and 4A to 4F are cross-sectional views taken along lines I-I', II-II', and III-III' of FIGS. 1A to 1F, respectively.

Referring to FIGS. 1A, 2A, 3A, and 4A, a buffer layer 110a may be formed on a substrate 100, and fin structures FS may be formed on the buffer layer 110a. The fin structures FS may extend in a first direction D1 and may be arranged spaced apart from each other along a second direction D2 intersecting the first direction D1. Each of the fin structures FS may include a buffer pattern 110b protruding upward from the buffer layer 110a and extending in the first direction D1, and an active pattern 120 provided on a top surface of the buffer pattern 110b to extend in the first direction D1. In other words, the fin structures FS may protrude from the buffer layer 110a in a third direction D3 perpendicular to all of the first and second directions D1 and D2. The first and second directions D1 and D2 may be parallel to a top surface of the substrate 100.

Forming the fin structures FS may include sequentially forming a preliminary buffer layer and an active layer on the substrate 100, and patterning the active layer and the preliminary buffer layer to form trenches T defining the fin structures FS. The preliminary buffer layer may include a material of which a lattice constant is different from that of the substrate 100. In example embodiments, the lattice constant of the preliminary buffer layer may be greater than that of the substrate 100. For example, if the substrate 100 is a silicon substrate, the preliminary buffer layer may include silicon-germanium (SiGe). In example embodiments, the preliminary buffer layer may be formed by a selective epitaxial growth (SEG) process using the substrate 100 as a seed. In example embodiments, the preliminary buffer layer may be formed by a chemical vapor deposition (CVD) process or a molecular beam epitaxy (MBE) process.

The active layer may include a material of which a lattice constant is different from that of the preliminary buffer layer. In example embodiments, the active layer may include a material of which a lattice constant is smaller than that of the preliminary buffer layer. For example, the preliminary buffer layer may be formed of $Si_{1-x}Ge_x$, and the active layer may be formed of silicon (Si). Alternatively, the preliminary buffer layer may be formed of $Si_{1-x}Ge_x$, and the active layer may be formed of $Si_{1-y}Ge_y$, where x>y. Thus, the preliminary buffer layer may provide a tensile strain to the active layer. In this case, in example embodiments, the semiconductor device may include an N-type metal-oxide-semiconductor field effect transistor (NMOSFET). In example embodiments, the active layer may include a material of which a lattice constant is greater than that of the preliminary buffer layer. For example, the preliminary buffer layer may be formed of $Si_{1-x}Ge_x$, and the active layer may be formed of germanium (Ge). Alternatively, the preliminary buffer layer may be formed of $Si_{1-z}Ge_z$, and the active layer may be formed of $Si_{1-w}Ge_w$, where z<w. Thus, the preliminary buffer layer may provide a compressive strain to the active layer. In this case, in example embodiments, the semiconductor device may include a P-type MOSFET (PMOSFET). Since the lattice constants of the preliminary buffer layer and the active layer are different from each other, a strain of the preliminary buffer layer may be relaxed but the strain may be applied to the active layer. In example embodiments, the active layer may be formed by a SEG process using the preliminary buffer layer as a seed. In example embodiments, the active layer may be formed by a CVD process or a MBE process.

Forming the trenches T may include forming a mask pattern (not shown) defining the fin structures FS on the active layer, and anisotropically etching the active layer and the preliminary buffer layer using the mask pattern as an etch mask. During the etching process, the active layer may be etched to form the active patterns 120 and an upper portion of the preliminary buffer layer may be etched to form the buffer patterns 110b. A lower portion of the preliminary buffer layer, which is not etched during the etching process, may be defined as the buffer layer 110a.

Device isolation layers 130 may be formed at both sides of each of the fin structures FS. The device isolation layers 130 may be formed to fill the trenches T. Forming the device isolation layers 130 may include forming an insulating layer filling the trenches T on the substrate 100, and planarizing the insulating layer until the mask pattern is exposed. Upper portions of the device isolation layers 130 may be recessed to expose an upper portion of each of the fin structures FS. In other words, at least a portion of each of the active patterns 120 may be exposed by the device isolation layers 130. Thus, top surfaces 130U of the device isolation layers 130 may be lower than top surfaces FS_U of the fin structures FS (e.g., top surfaces 120U of the active patterns 120). For example, the device isolation layers 130 may include at least one of silicon oxide, silicon nitride, or silicon oxynitride.

According to example embodiments, as illustrated in FIGS. 2A and 3A, the top surfaces 130U of the device isolation layers 130 may be lower than bottom surfaces 120L of the active patterns 120. In this case, upper portions of the buffer patterns 110b may be exposed by the device isolation layers 130. Alternatively, unlike FIGS. 2A and 3A, the top surfaces 130U of the device isolation layers 130 may be higher than the bottom surfaces 120L of the active patterns 120. In this case, the buffer patterns 110b may not be exposed by the device isolation layers 130. Recessing the upper portions of the device isolation layers 130 may be performed using, for example, a wet etching process and may be performed using an etch recipe having an etch selectivity with respect to the fin structures FS.

Referring to FIGS. 1B, 2B, 3B, and 4B, an etch stop layer and a sacrificial gate layer may be sequentially formed on the substrate 100 to cover the fin structures FS and the device isolation layers 130. The etch stop layer may include, for example, a silicon oxide layer. The sacrificial gate layer may include a material having an etch selectivity with respect to the etch stop layer. For example, the sacrificial gate layer may include poly-silicon.

The sacrificial gate layer may be patterned to form a sacrificial gate pattern 134. The sacrificial gate pattern 134 may extend in the second direction D2 to intersect the fin structures FS. Forming the sacrificial gate pattern 134 may include forming a gate mask pattern 136 on the sacrificial gate layer, and etching the sacrificial gate layer using the gate mask pattern 136 as an etch mask. The gate mask pattern 136 may include, for example, silicon nitride. Etching the sacrificial gate layer may include performing an etching process having an etch selectivity with respect to the etch stop layer.

After the formation of the sacrificial gate pattern 134, the etch stop layer at both sides of the sacrificial gate pattern 134 may be removed to form an etch stop pattern 132 under the sacrificial gate pattern 134. The etch stop pattern 132 may extend along a bottom surface of the sacrificial gate pattern 134 to cover top surfaces and sidewalls of the fin structures FS and top surfaces of the device isolation layers 130. The etch stop pattern 132, the sacrificial gate pattern 134, and the gate mask pattern 136 may constitute a sacrificial gate structure.

Since the sacrificial gate pattern 134 is formed to intersect the fin structures FS, a first portion P1 and second portions P2 may be defined in each of the fin structures FS. The first portion P1 may correspond to a portion of the fin structure FS which is disposed under the sacrificial gate pattern 134 and vertically overlaps with the sacrificial gate pattern 134. The second portions P2 may correspond to other portions of the fin structure FS which are disposed at both sides of the sacrificial gate pattern 134 and are laterally spaced apart from each other with the first portion P1 interposed therebetween. A top surface of the first portion P1 may be substantially coplanar with top surfaces of the second portions P2.

Next, a gate spacer layer 140 may be conformally formed on the substrate 100. The gate spacer layer 140 may cover the top surfaces of the device isolation layers 130 disposed at both sides of the sacrificial gate pattern 134, the top surfaces and sidewalls of the second portions P2 of the fin structures FS, and a top surface and sidewalls of the sacrificial gate structure. For example, the gate spacer layer 140 may include at least one of silicon nitride (SiN), silicon carbonitride (SiCN), or silicon oxycarbonitride (SiOCN). The gate spacer layer 140 may be formed by a deposition process such as a CVD process or an atomic layer deposition (ALD) process.

Referring to FIGS. 1C, 2C, 3C, and 4C, the gate spacer layer 140 may be etched to form gate spacers GSP on sidewalls of the sacrificial gate pattern 134, respectively. The gate spacer layer 140 may be etched using an ion beam etching process. During the ion beam etching process, an ion beam irradiated to the substrate 100 may have specific directivity. In detail, the ion beam may be irradiated in substantially parallel to a plane defined by one direction (e.g., the extending direction of the sacrificial gate pattern 134, e.g., the second direction D2) and a direction (e.g., the third direction D3) perpendicular to the top surface of the substrate 100. In addition, the irradiation direction of the ion beam may be tilted from the direction (e.g., the third direction D3) perpendicular to the top surface of the substrate 100 in a cross-sectional view (e.g., in a cross-sectional view defined by the one direction (e.g., the second direction D2) and the third direction D3). In detail, the ion beam may have a desired (and/or alternatively predetermined) tilt angle range from the third direction D3 in the cross-sectional view.

The top surfaces of the second portions P2 of the fin structures FS and the top surfaces of the device isolation layers 130 disposed at both sides the sacrificial gate pattern 134 may be exposed by the ion beam etching process. In addition, sidewalls of the second portions P2 of the fin structures FS may be exposed during the ion beam etching process. A portion of the gate mask pattern 136 may be etched during the ion beam etching process, and a residual portion of the gate mask pattern 136 may remain on the sacrificial gate pattern 134 after the ion beam etching process. As a result, portions of the gate spacer layer 140 may remain on the sidewalls of the sacrificial gate pattern 134 to form the gate spacers GSP. Hereinafter, an ion beam etching process according to example embodiments of inventive concepts will be described in more detail with reference to FIGS. 5 to 9.

Figure 5:
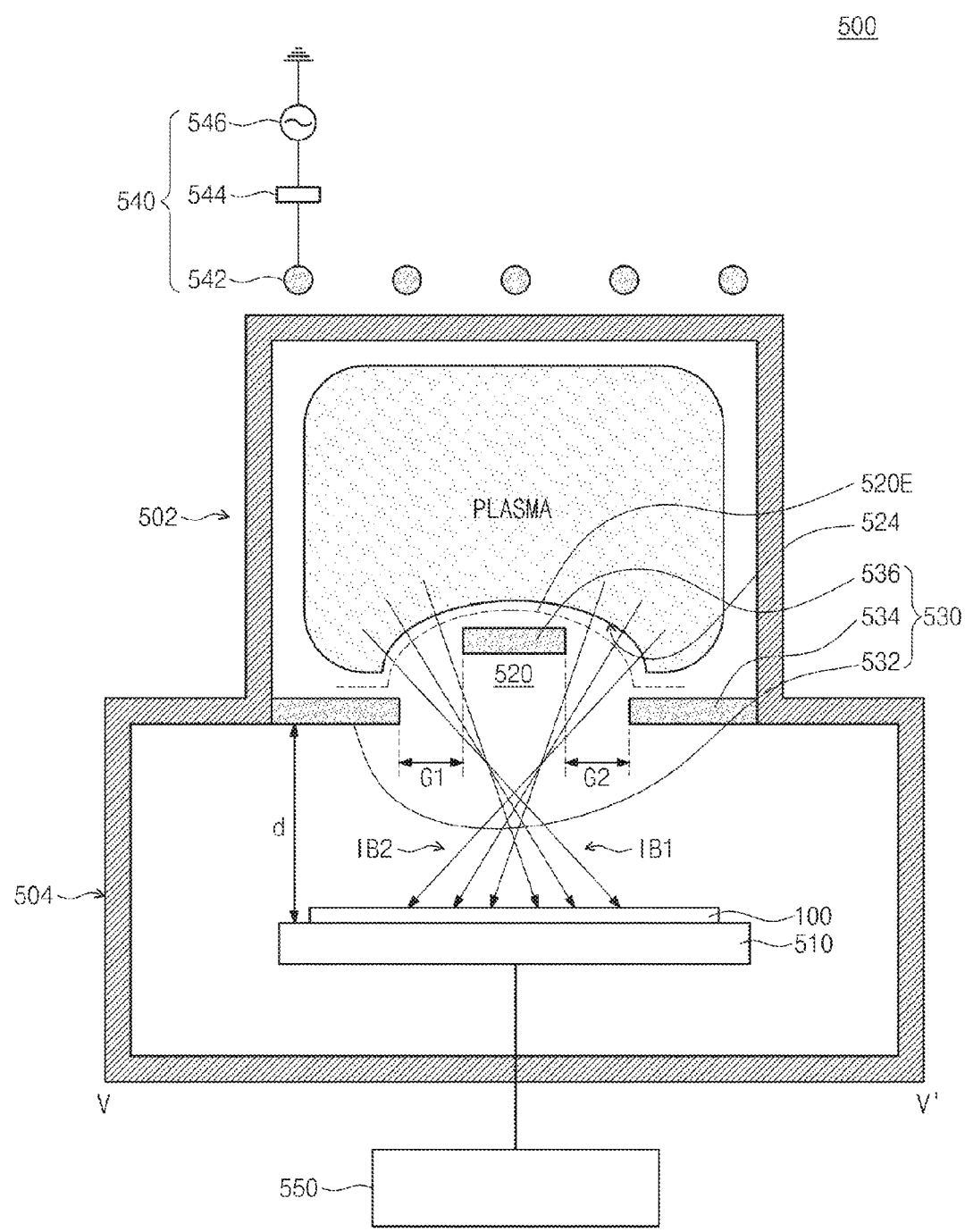
FIG. 5 is a schematic diagram illustrating an example of an ion beam etching apparatus for performing an ion beam etching process according to example embodiments of inventive concepts.
Figure 6:
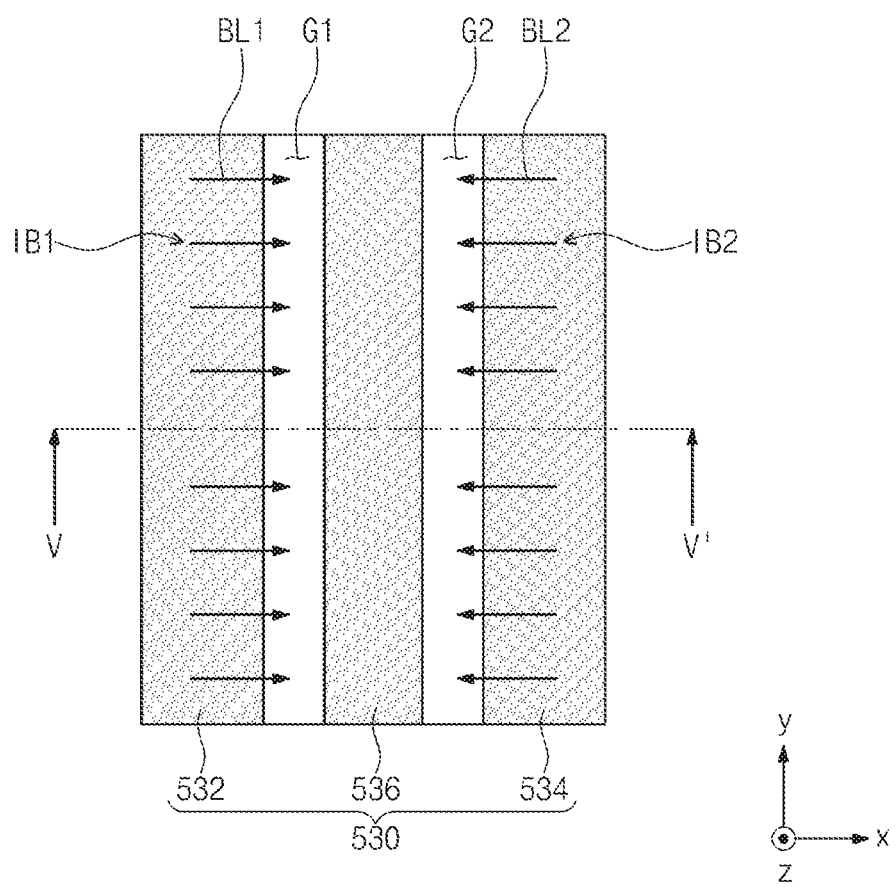
FIG. 6 is a plan view illustrating an ion beam control unit of FIG. 5.
Figure 7:
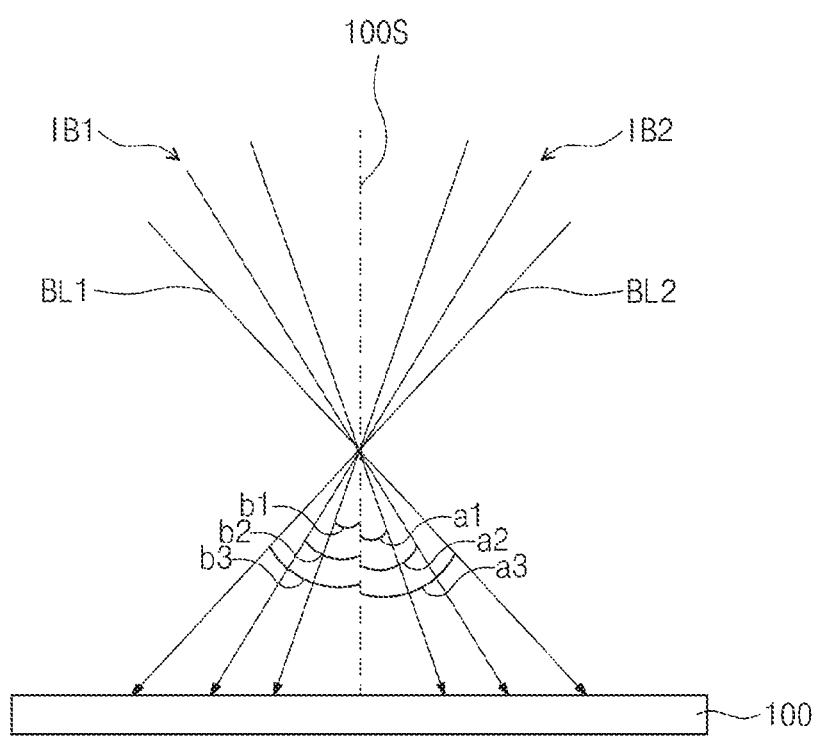
FIG. 7 is a conceptual diagram illustrating an ion beam passing through the ion beam control unit of FIG. 5 so as to be irradiated to a substrate.
Figure 8:
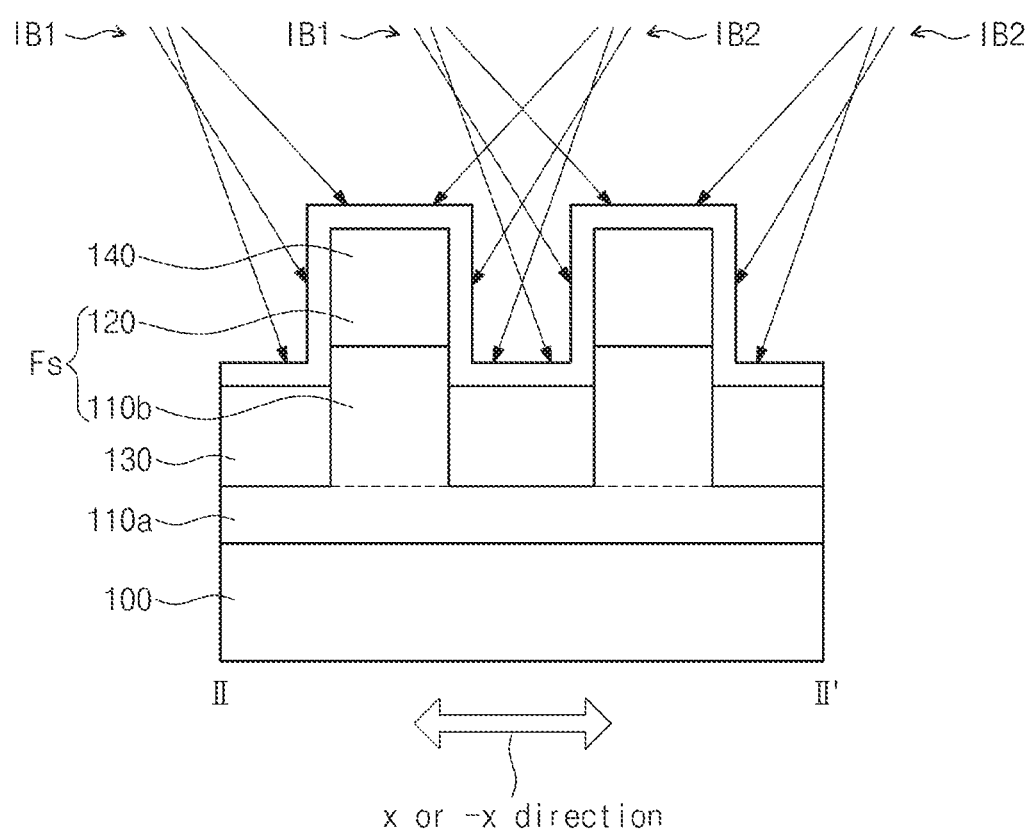
FIGS. 8 and 9 are cross-sectional views that correspond to FIGS. 2B and 4B, respectively, to illustrate an ion beam etching process according to an embodiment of inventive concepts.
Figure 9:
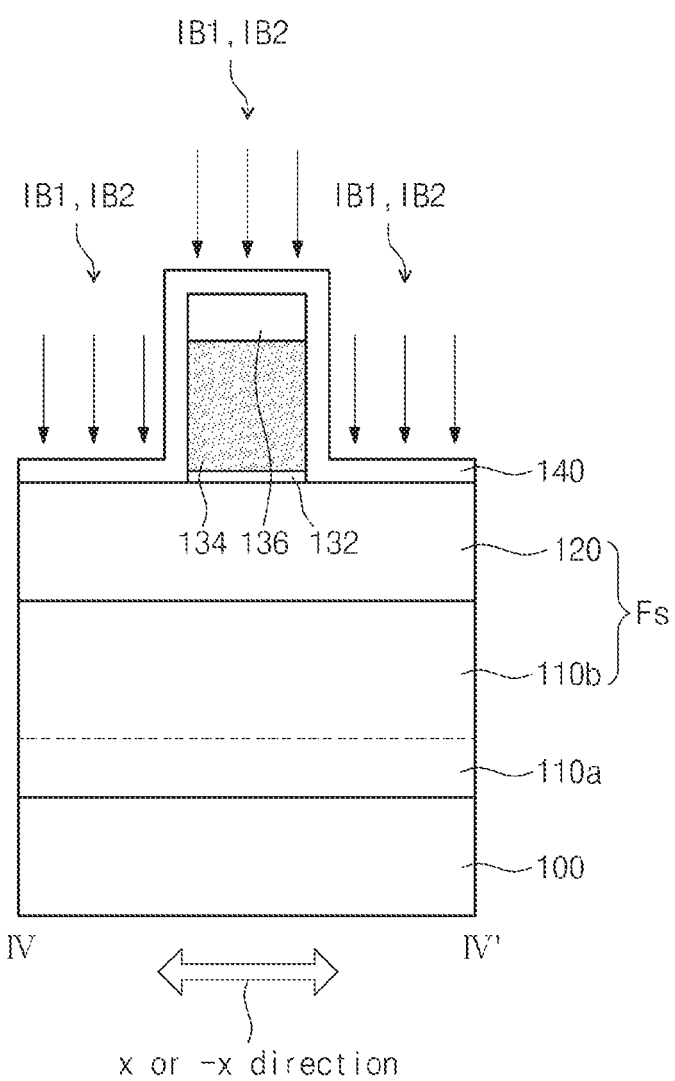

FIG. 5 is a schematic diagram illustrating an example of an ion beam etching apparatus for performing an ion beam etching process according to example embodiments of inventive concepts. FIG. 6 is a plan view illustrating an ion beam control unit of FIG. 5. FIG. 7 is a conceptual diagram illustrating an ion beam passing through the ion beam control unit of FIG. 5 so as to be irradiated to a substrate. FIGS. 8 and 9 are cross-sectional views that correspond to FIGS. 2B and 4B, respectively, to illustrate an ion beam etching process according to example embodiments of inventive concepts.

Referring to FIGS. 5 to 7, an ion beam etching apparatus 500 may include a source chamber 502 generating ion beams IB1 and IB2, a process chamber 504 performing the ion beam etching process using the ion beams IB1 and IB2, a plasma generation unit 540, and a bias source 550. The source chamber 502 may be connected to the process chamber 504, so an inner space of the source chamber 502 may be connected to an inner space of the process chamber 504.

A source gas may be supplied into the source chamber 502. The source gas may include a reactive gas. For example, if the gate spacer layer 140 is formed of a nitride-based material (e.g., silicon nitride, silicon carbonitride, or silicon oxycarbonitride), the source gas may include a mixed gas of a fluorine-based etching as and an oxygen ($O_2$) gas. For example, the fluorine-based etching gas may include at least one of, but not limited to, $CH_3F$, $CF_4$, $C_2F_6$, $SiF_4$, or $NF_3$. According to example embodiments of inventive concepts, an oxygen fraction of the source gas (e.g., a partial pressure ratio of the oxygen gas in the source gas) may be 50% or more. For example, the partial pressure ratio of the oxygen gas may range from 50% to 80%. If the partial pressure ratio of the oxygen gas is lower than 50%, an etch selectivity of the ion beam etching process may be deteriorated, e.g., a difference between etch rates of the gate spacer layer 140 and the active patterns 120 may be reduced. If the partial pressure ratio of the oxygen gas is higher than 80%, the etch rate of the gate spacer layer 140 may be reduced.

The plasma generation unit 540 may convert the source gas supplied in the source chamber 502 into plasma. The plasma in the source chamber 502 may act as a source of the ion beams IB1 and IB2. In example embodiments, the plasma generation unit 540 may include a plasma power generator 546 and an electrode 542 connected to the plasma power generator 546. The plasma power generator 546 may generate plasma power and may apply the plasma power to the electrode 542. For example, the plasma power may be radio frequency (RF) power. The electrode 542 may have a closed-loop shape or a coil shape. The plasma may be induced by the plasma power applied to the electrode 542. The plasma power (e.g., the RF power) may be variously controlled according to a desired density of the plasma. In example embodiments, the ion beam etching process according to example embodiments of inventive concepts may be performed using the plasma power ranging from 0.5 kW to 10 kW. However, example embodiments of inventive concepts are not limited thereto.

The plasma generation unit 540 may further include a matching unit 544 connected between the plasma power generator 546 and the electrode 542. The plasma power may be transmitted from the plasma power generator 546 to the electrode 542 through the matching unit 544. The matching unit 544 may increase transmission efficiency of the plasma power. However, example embodiments of inventive concepts are not limited to the plasma generation unit 540 described above. In other words, the plasma generation unit 540 may have another shape or structure generating plasma.

The process chamber 504 may include a stage 510 on which a substrate 100 corresponding to an etch target may be loaded. The stage 510 may be configured to rotate on a rotation axis perpendicular to a top surface of the stage 510 and may be configured to linearly move along rectangular coordinate axes parallel to the top surface of the stage 510. In addition, the stage 510 may be configured to linearly move in a direction perpendicular to the top surface of the stage 510. The substrate 100 loaded on the stage 510 may also rotate and linearly move by the rotation and linear movement of the stage 510. During the ion beam etching process, the stage 510 may linearly move in an x-direction (see FIG. 6) or in a direction opposite the x-direction.

The bias source 550 may apply an ion extraction voltage to the substrate 100. The ion beam etching process according to example embodiments of inventive concepts may be performed using the ion extraction voltage ranging from 200V to 1000V. Since the ion extraction voltage is applied to the substrate 100, ions provided from the plasma may intersect a plasma sheath 520 so as to be irradiated to the substrate 100. The ions irradiated to the substrate 100 may constitute the ion beams IB1 and IB2. Here, the plasma sheath 520 may be defined as a region that has fewer electrons than an amount of the electrons of the plasma between the plasma and the substrate 100. According to example embodiments of inventive concepts, the bias source 550 may be driven in a pulsed manner. In example embodiments, the bias source 550 may be a pulsed DC power supply. However, example embodiments of inventive concepts are not limited thereto. The ion extraction voltage applied to the substrate 100 may be turned on and off in a desired (and/or alternatively predetermined) cycle. In the ion beam etching process according to example embodiments of inventive concepts, a duty cycle of the ion extraction voltage may range from 50% to 75%. Here, the duty cycle may be defined as a ratio of an on-state time of the ion extraction voltage to a total duration of a cycle in which the ion extraction voltage is turned on and off.

The duty cycle of the ion extraction voltage may be controlled along with the partial pressure ratio of the oxygen gas described above, thereby controlling the ratio between the etch rate of the gate spacer layer 140 and the etch rate of the active patterns 120. In example embodiments, the ratio of the etch rate of the gate spacer layer 140 to the etch rate of the active patterns 120 may be in a range of 20:1 to 50:1.

An ion beam control unit 530 may be provided within the source chamber 502. The ion beam control unit 530 may include a first insulator 532 and a second insulator 534 which are laterally spaced apart from each other and are disposed at the same level from the substrate 100. For example, the first and second insulators 532 and 534 may be spaced apart from the stage 510 by a distance d. The distance d between the stage 510 and the first and second insulators 532 and 534 may be adjusted by the vertical movement of the stage 510. According to example embodiments, the distance d between the stage 510 and the first and second insulators 532 and 534 may be greater than 0 (zero) and equal to or less than 100 mm. Hereinafter, the distance d between the stage 510 and the first and second insulators 532 and 534 may be called 'a Z-gap d'.

The ion beam control unit 530 may further include a third insulator 536 which is provided between the first and second insulators 532 and 534 in a plan view and is disposed at a higher level than the first and second insulators 532 and 534. In other words, the level of the third insulator 536 from the substrate 100 may be higher than the level of the first and second insulators 532 and 534 from the substrate 100. For example, the insulators 532, 534 and 536 may be formed of quartz, glass, and/or silicon nitride, but example embodiments are not limited thereto.

As illustrated in FIG. 6, each of the first to third insulator 532, 534 and 536 may have a bar shape extending in one direction (e.g., a y-direction) when viewed from a plan view. However, example embodiments are not limited thereto. The shapes of the first to third insulators 532, 534 and 536 may be variously modified. The ion beam control unit 530 may change a form of an electric field 520E in the plasma sheath 520 to control a shape of a boundary line 524 between the plasma and the plasma sheath 520. According to example embodiments, the plasma may be provided on the substrate 100, and the ion beam control unit 530 may be provided between the plasma and the substrate 100. The ion beam control unit 530 may control the boundary line 524 between the plasma and the plasma sheath 520 to control shapes and incident angles of the ion beams IB1 and IB2 irradiated to the surface of the substrate 100 loaded on the stage 510. FIG. 5 illustrates a sectional view of the ion beam control unit 530 taken along line V-V' of FIG. 6.

In detail, the ions provided from the plasma may pass through the boundary line 524 between the first and third insulators 532 and 536 so as to be irradiated to the substrate 100 through a first gap region G1 between the first and third insulators 532 and 536. In addition, the ions provided from the plasma may pass through the boundary line 524 between the second and third insulators 534 and 536 so as to be irradiated to the substrate 100 through a second gap region G2 between the second and third insulators 534 and 536. The ions irradiated to the substrate 100 through the first gap region G1 may constitute a first ion beam IB1, and the ions irradiated to the substrate 100 through the second gap region G2 may constitute a second ion beam IB2. The first and second ion beams IB1 and IB2 may be irradiated to the substrate 100 at the same time.

Meanwhile, as illustrated in FIG. 6, each of the gap regions G1 and G2 may have a rectangular shape having a long axis parallel to the extending direction (e.g., the y-direction) of the insulators 532, 534 and 536 when viewed from a plan view. In other words, each of the gap regions G1 and G2 may have a width in a short axis direction (e.g., the x-direction) and a length in a long axis direction (e.g., the y-direction). In example embodiments, the lengths of the gap regions G1 and G2 may be equal to or greater than a diameter of the substrate 100. The ion beams IB1 and IB2 passing through the gap regions G1 and G2 may be irradiated to regions of the substrate 100 which corresponds to ranges defined by the widths and lengths of the gap regions G1 and G2. In other words, the ion beams IB1 and IB2 may be realized as ribbon beams. Each of the ion beams IB1 and IB2 realized as the ribbon beams may include a plurality of beamlets BL1 or BL2.

The beamlets BL1 and BL2 of the first and second ion beams IB1 and IB2 may be tilted from the normal line 100S perpendicular to the top surface of the substrate 100 (e.g., the top surface of the stage 510). In a plan view, irradiation directions of the beamlets BL1 of the first ion beam IB1 may have vector components in the x-direction, and irradiation directions of the beamlets BL2 of the second ion beam BL2 may have vector components in a direction opposite to the x-direction (e.g., in a −x-direction). In example embodiments, the irradiation directions of the beamlets BL1 and BL2 of the first and second ion beams IB1 and IB2 may be substantially parallel to an x-z plane defined by the x-direction and a z-direction. In other words, the irradiation directions of the beamlets BL1 and BL2 of the first and second ion beams IB1 and IB2 may not have vector components in the y-direction and vector components in a direction opposite to the y-direction.

The beamlets BL1 and BL2 of the ion beams IB1 and IB2 may be tilted with respect to the normal line 100S in desired (and/or alternatively predetermined) angle ranges. In other words, the ion beams IB1 and IB2 may have incident angle ranges. For example, as illustrated in FIG. 7, the first ion beam IB1 may include the beamlets BL1 having first to third incident angles a1, a2 and a3 different from each other. If the first incident angle a1 and the third incident angle a3 correspond to the minimum incident angle and the maximum incident angle of the first ion beam IB1, respectively, the first ion beam IB1 may have a first incident angle range between the first incident angle a1 and the third incident angle a3. Likewise, the second ion beam IB2 may include the beamlets BL2 having fourth to sixth incident angles b1, b2 and b3 different from each other. If the fourth incident angle b1 and the sixth incident angle b3 correspond to the minimum incident angle and the maximum incident angle of the second ion beam IB2, respectively, the second ion beam IB2 may have a second incident angle range between the fourth incident angle b1 and the sixth incident angle b3. In example embodiments, the first incident angle range of the first ion beam IB1 may be substantially equal to the second incident angle range of the second ion beam IB2. In this case, the first ion beam IB1 and the second ion beam IB2 may be symmetrical with respect to the normal line 100S. For example, each of the first and second incident angle ranges of the first and second ion beams IB1 and IB2 may be greater than 0 degree and less than 60 degrees. In particular, each of the first and second incident angles may be from 10 degrees to 50 degrees.

The first incident angle range and the second incident angle range may be designed in consideration of a distance between the fin structures FS, a thickness of the gate spacer layer 140, and a height difference between the fin structures FS and the device isolation layers 130. In addition, the incident angle of each of the beamlets BL1 and BL2 or the incident angle ranges of the ion beams IB1 and IB2 may be controlled by various process parameters such as the plasma power, the ion extraction voltage, and/or the Z-gap d.

In example embodiments, the ion beam etching process may be performed in the ion beam etching apparatus 500 described above. In detail, the substrate 100 having the gate spacer layer 140 may be loaded on the stage 510 of the ion beam etching apparatus 500. At this time, the substrate 100 on the stage 410 may be aligned in such a way that the extending direction of the sacrificial gate pattern 134 is parallel to the short axis direction (e.g., the x or −x-direction) of the gap regions G1 and G2. The alignment of the substrate 100 may be performed by, for example, the rotation of the stage 510. Thereafter, the ion beams IB1 and IB2 may be irradiated to the aligned substrate 100. Since the extending direction of the sacrificial gate pattern 134 is parallel to the short axis direction of the gap regions G1 and G2, the ion beams IB1 and IB2 may be tilted with the normal line perpendicular to the top surface of the substrate 100 and may be substantially parallel to a plane defined by the extending direction of the sacrificial gate pattern 134 and the direction perpendicular to the top surface of the substrate 100. In other words, as illustrated in FIGS. 8 and 9, the ion beams IB1 and IB2 may be irradiated to the sidewalls, opposite to each other in the second direction D2, of each of the fin structures FS at tilt angles but may not be irradiated to the sidewalls, opposite to each in the first direction D1, of the sacrificial gate pattern 134. In addition, the ion beams IB1 and IB2 may also be irradiated to the top surfaces of the fin structures FS, the top surface of the sacrificial gate pattern 134, and the top surfaces of the device isolation layers 130 disposed at both sides of the sacrificial gate pattern 134. The substrate 100 may be scanned during the ion beam etching process such that the ion beams IB1 and IB2 may be uniformly irradiated to an entire region of the substrate 100. Scanning the substrate 100 may be performed by moving the stage 510 in the x-direction or the −x-direction. Scanning the substrate 100 may be repeatedly performed until the top surfaces of the device isolation layers 130 at both sides of the sacrificial gate pattern 134, the top surfaces and the sidewalls of the second portion P2 of the fin structures FS, and the top surface of the gate mask pattern 136 are exposed.

If the gate spacers GSP are formed using a general anisotropic etching method (e.g., a reactive ion etching method) performed in a direction perpendicular to the top surface of the substrate 100, the general anisotropic etching process may be continuously performed to etch the gate spacer layer 140 disposed on the sidewalls of the fin structures FS after the gate spacer layer 140 disposed on the top surface of the fin structures FS and the top surface of the sacrificial gate pattern 134 is fully removed. Thus, upper portions of the fin structures FS may be over-etched, and the gate spacer layer 140 disposed on the sidewalls of the sacrificial gate pattern 134 may also be over-etched. If heights of the fin structures FS are reduced by the over-etching of the upper portions of the fin structures FS, a margin of a process for forming cladding layers 145 to be described later may be reduced. However, when the gate spacer layer 140 is etched using the ion beam etching process according to example embodiments of inventive concepts, the gate spacer layer 140 on the sidewalls of the fin structures FS may be effectively removed to form the gate spacers GSP while reducing and/or minimizing damage of the fin structures FS. In addition, damage of the gate spacers GSP may also be reduced and/or minimized. Next, subsequent processes of the method for manufacturing the semiconductor device according to example embodiments of inventive concepts will be continuously described.

Referring to FIGS. 1D, 2D, 3D, and 4D, cladding layers 145 may be formed at both sides of the sacrificial gate patterns 134. The cladding layers 145 may be formed on the second portions P2 of the fin structures FS, respectively. Each of the cladding layers 145 may cover the top surface and the sidewalls of each of the second portions P2 of the fin structures FS. In other words, each of the cladding layers 145 may cover the top surface and the sidewalls of each of the second regions R2 of the active patterns 120.

Forming the cladding layers 145 may include performing a selective epitaxial growth (SEG) process using the upper portions of the fin structures FS exposed by the device isolation layers 130 as a seed. In other words, the cladding layers 145 may be epitaxial layers. If the cladding layers 145 are included in a PMOSFET, the cladding layers 145 may be formed of a material providing a compressive strain to the active patterns 120. For example, if the active patterns 120 include silicon-germanium (SiGe), the cladding layers 145 may be formed of SiGe layers of which a lattice constant is greater than that of the active patterns 120. In other words, a germanium concentration of the cladding layers 145 may be higher than that of the active patterns 120. Alternatively, if the cladding layers 145 are included in an NMOSFET, the cladding layers 145 may be formed of a material providing a tensile strain to the active patterns 120. For example, if the active patterns 120 include Si, the cladding layers 145 may be formed of silicon carbide (SiC) layers having a lattice constant less than that of the active patterns 120 or may be formed of silicon (Si) layers having a lattice constant substantially equal to that of the active patterns 120. Another example, if the active patterns 120 include SiGe, the cladding layers 145 may be formed of SiGe layers having a lower germanium concentration than the active patterns 120. However, example embodiments are not limited thereto.

Each of the cladding layers 145 may have a first sidewall 145S1 negatively inclined to the top surface of the substrate 100, a third sidewall 145S3 positively inclined to the top surface of the substrate 100, and a second sidewall 145S2 between the first and third sidewalls 145S1 and 145S3. The second sidewall 145S2 may be substantially perpendicular to the top surface of the substrate 100, but example embodiments of inventive concepts are not limited thereto. One end of the second sidewall 145S2 adjacent to the substrate 100 may be connected to one end of the first sidewall 145S1, and another end of the second sidewall 145S2 may be connected to one end of the third sidewall 145S3. A length of the second sidewall 145S2 may be greater than that of each of the first and third sidewalls 145S1 and 145S3 when viewed from a cross-sectional view. The lengths of the first to third sidewalls 145S1, 145S2 and 145S3 in the cross-sectional view may be defined as lengths measured along cross-sectional profiles of the first to third sidewalls 145S1, 145S2 and 145S3. According to example embodiments of inventive concepts, losses of the second portions P2 of the fin structures FS may be reduced and/or minimized during the formation of the gate spacers GSP to reduce and/or inhibit lateral growth of the cladding layers 145 during the SEG process. Thus, the aforementioned sidewall shapes of the cladding layers 145 may be realized. On the other hand, if the cladding layers 145 adjacent to each other are respectively included in MOSFETs of which types are different from each other, it may be necessary to limit and/or prevent the adjacent cladding layers 145 from being connected to each other. According to example embodiments of inventive concepts, since the lateral growth of the cladding layers 145 is limited and/or inhibited during the formation of the cladding layers 145, it is possible to limit (and/or prevent) the cladding layers 145 respectively disposed on adjacent fin structures FS from being in contact with each other. As a result, the margin of the process of forming the cladding layers 145 may be increased or improved.

The cladding layers 145 may be doped with dopants to form source/drain regions SD. For example, the cladding layers 145 may be doped with N-type dopants (e.g., phosphorus or arsenic) or P-type dopants (e.g., boron) during or after the SEG process. In example embodiments, portions of the second portions P2 of the fin structures FS may also be doped with the dopants during the dopant doping process described above. However, in this case, a dopant concentration of the second portions P2 may not be sufficient. According to example embodiments of inventive concepts, a process of doping the second portions P2 of the fin structures FS with N-type or P-type dopants may be performed before the formation of the cladding layers 145. Thus, the second portions P2 of the fin structures FS may have a sufficient dopant concentration. The cladding layers 145 and the doped portions of the second portions P2 may constitute the source/drain regions SD. Since the second portions P2 of the fin structures FS have the sufficient dopant concentration, electrical characteristics of the source/drain regions SD may be improved. Doping the second portions P2 of the fin structures FS with the dopants may be performed by an ALD doping method, a plasma doping method, an ion implantation method, or a monolayer doping (MLD) method. As a result, the source/drain regions SD may be formed at both sides of the sacrificial gate pattern 134.

Referring to FIGS. 1E, 2E, 3E, and 4E, a lower interlayer insulating layer 150 may be formed on the substrate 100 having the source/drain regions SD. The lower interlayer insulating layer 150 may be formed to cover the source/drain regions SD and the sacrificial gate pattern 134. The lower interlayer insulating layer 150 may also cover the cladding layers 145. The lower interlayer insulating layer 150 may include at least one of a silicon oxide layer, a silicon nitride layer, a silicon oxynitride layer, or low-k dielectric layers.

Subsequently, the gate mask pattern 136, the sacrificial gate pattern 134, and the etch stop pattern 132 may be removed to form a gate region 160 between the gate spacers GSP. The gate region 160 may expose the first portions P1 of the fin structures FS. A portion of the lower interlayer insulating layer 150 may be etched during an etching process of removing the gate mask pattern 136. Forming the gate region 160 may include etching the sacrificial gate pattern 134 by performing an etching process having an etch selectivity with respect to the gate spacers GSP, the lower interlayer insulating layer 150 and the etch stop pattern 132. In addition, forming the gate region 160 may include removing the etch stop pattern 132 to expose the first portions P1 of the fin structures FS.

Referring to FIGS. 1F, 2F, 3F, and 4F, a gate insulating pattern GD and a gate electrode GE may be formed to fill the gate region 160. In detail, a gate insulating layer (not shown) may be formed on the substrate 100 to partially fill the gate region 160. The gate insulating layer may be formed to cover the first portions P1 of the fin structures FS. The gate insulating layer may include at least one insulating material (e.g., at least one high-k dielectric layer). For example, the gate insulating layer may include at least one of, but not limited to, hafnium oxide, hafnium silicate, zirconium oxide, or zirconium silicate. The gate insulating layer may be formed by, for example, an atomic layer deposition (ALD) process or a chemical vapor deposition (CVD) process. A gate layer (not shown) may be formed on the gate insulating layer to fill the rest region of the gate region 160. The gate layer may include at least one of a conductive metal nitride (e.g., titanium nitride, tantalum nitride, or tungsten nitride) or a metal (e.g., aluminum or tungsten). The gate insulating layer and the gate layer sequentially stacked may be planarized to form the gate insulating pattern GD and the gate electrode GE. Top surfaces of the lower interlayer insulating layer 150 and the gate spacers GSP may be exposed by the planarization process. The gate insulating pattern GD may extend along a bottom surface of the gate electrode GE and may extend onto both sidewalls of the gate electrode GE so as to be disposed between the gate electrode GE and the gate spacers GSP.

An upper portion of the gate electrode GE may be recessed. An upper portion of the gate insulating pattern GD may also be removed during the process of recessing the gate electrode GE, so a recess region may be defined in the gate region 160. A gate capping pattern GP may be formed in the recess region. Forming the gate capping pattern GP may include forming a capping layer filling the recess region on the lower interlayer insulating layer 150, and planarizing the capping layer until the lower interlayer insulating layer 150 is exposed. The gate capping pattern GP may include, for example, silicon nitride.

The gate insulating pattern GD, the gate electrode GE, the gate capping pattern GP, and the gate spacers GSP may be defined as a gate structure GS. The gate structure GS may extend in the second direction D2.

According to example embodiments, an upper interlayer insulating layer (not shown) may be formed on the substrate 100 including the gate structure GS. The upper interlayer insulating layer may include an oxide, a nitride, and/or an oxynitride. First contact holes (not shown) may be formed to penetrate the upper interlayer insulating layer and the lower interlayer insulating layer 150 and to expose the source/drain regions SD. Upper portions of the source/drain regions SD may be partially removed during an etching process for forming the first contact holes. A second contact hole (not shown) may be formed to penetrate the upper interlayer insulating layer and the lower interlayer insulating layer 150 and to expose the gate electrode GE. Thereafter, first contact plugs may be formed to fill the first contact holes, and a second contact plug may be formed to fill the second contact hole. Interconnections may be formed on the upper interlayer insulating layer so as to be connected to the first and second contact plugs. Voltages may be applied to the source/drain regions SD and the gate electrode GE through the interconnections and the first and second contact plugs. The first and second contact plugs and the interconnections may include a conductive material.

According to example embodiments of inventive concepts, the fin structure may include the buffer pattern and the active pattern, and the lattice constant of the active pattern may be different from that of the buffer pattern. Thus, the buffer pattern may provide the tensile or compressive strain to the active pattern. The active pattern may function as a channel of the transistor formed on the fin structure. Since the buffer pattern provides the tensile or compressive strain to the active pattern, it is possible to provide the method for manufacturing the semiconductor device with improved channel characteristics.

In addition, since the gate spacers may be formed on the sidewalls of the sacrificial gate pattern by means of the etching process using the ion beam having the specific directivity, etch damage of the fin structure at both sides of the sacrificial gate pattern may be reduced and/or minimized. Thus, the cladding layers may be uniformly grown from the fin structure disposed at both sides of the sacrificial gate pattern, thereby increasing and/or improving the process margin of the process of forming the cladding layers. As a result, it is possible to provide the methods for forming the semiconductor device which are capable of improving electrical characteristics and of increasing the process margin of the process of forming the cladding layers.

Figure 10:
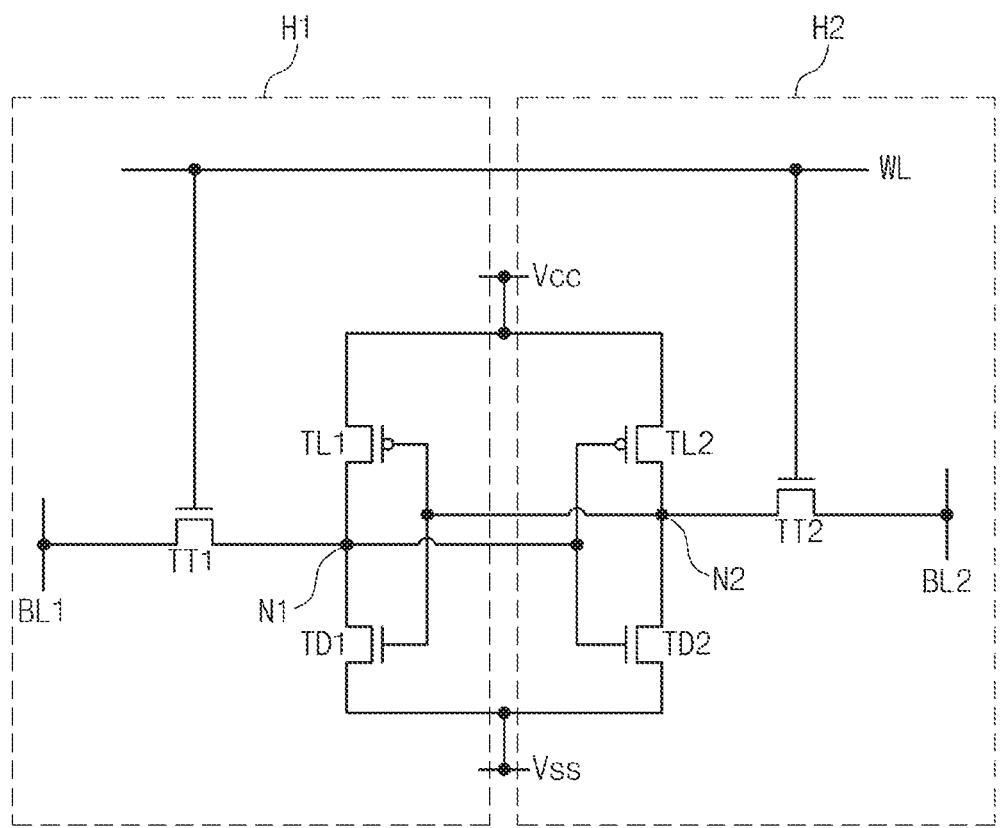
FIG. 10 is an equivalent circuit diagram illustrating a complementary metal-oxide-semiconductor static random access memory (CMOS SRAM) cell including a semiconductor device according to example embodiments of inventive concepts.

FIG. 10 is an equivalent circuit diagram illustrating a complementary metal-oxide-semiconductor static random access memory (CMOS SRAM) cell including a semiconductor device according to example embodiments of inventive concepts. Referring to FIG. 10, a CMOS SRAM cell may include a pair of driver transistors TD1 and TD2, a pair of transfer transistors TT1 and TT2, and a pair of load transistors TL1 and TL2. The driver transistors TD1 and TD2 may correspond to pull-down transistors, the transfer transistors TT1 and TT2 may correspond to pass transistors, and the load transistors TL1 and TL2 may correspond to pull-up transistors. The driver transistors TD1 and TD2 and the transfer transistors TT1 and TT2 may be NMOS transistors, and the load transistors TL1 and TL2 may be PMOS transistors. At least one of the transistors according to the aforementioned example embodiments of inventive concepts may be at least one of the driver transistors TD1 and TD2, the transfer transistors TT1 and TT2 and/or the driver transistors TL1 and TL2.

The first driver transistor TD1 and the first transfer transistor TT1 may be in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be in series to each other. A source region of the second driver transistor TD2 may be electrically connected to the ground line Vss, and a drain region of the second transfer transistor TT2 may be electrically connected to a second bit line BL2.

A source region and a drain region of the first load transistor TL1 may be electrically connected to a power line Vcc and a drain region of the first driver transistor TD1, respectively. A source region and a drain region of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may correspond to a first node N1. The drain region of the second load transistor TL2, the drain region of the second driver transistor TD2, and a source region of the second transfer transistor TT2 may correspond to a second node N2. A gate electrode of the first driver transistor TD1 and a gate electrode of the first load transistor TL1 may be electrically connected to the second node N2. A gate electrode of the second driver transistor TD2 and a gate electrode of the second load transistor TL2 may be electrically connected to the first node N1. Gate electrodes of the first and second transfer transistors TT1 and TT2 may be electrically connected to a words line WL. The first driver transistor TD1, the first transfer transistor TT1, and the first load transistor TL1 may constitute a first half-cell H1. The second driver transistor TD2, the second transfer transistor TT2, and the second load transistor TL2 may constitute a second half-cell H2.

Figure 11:
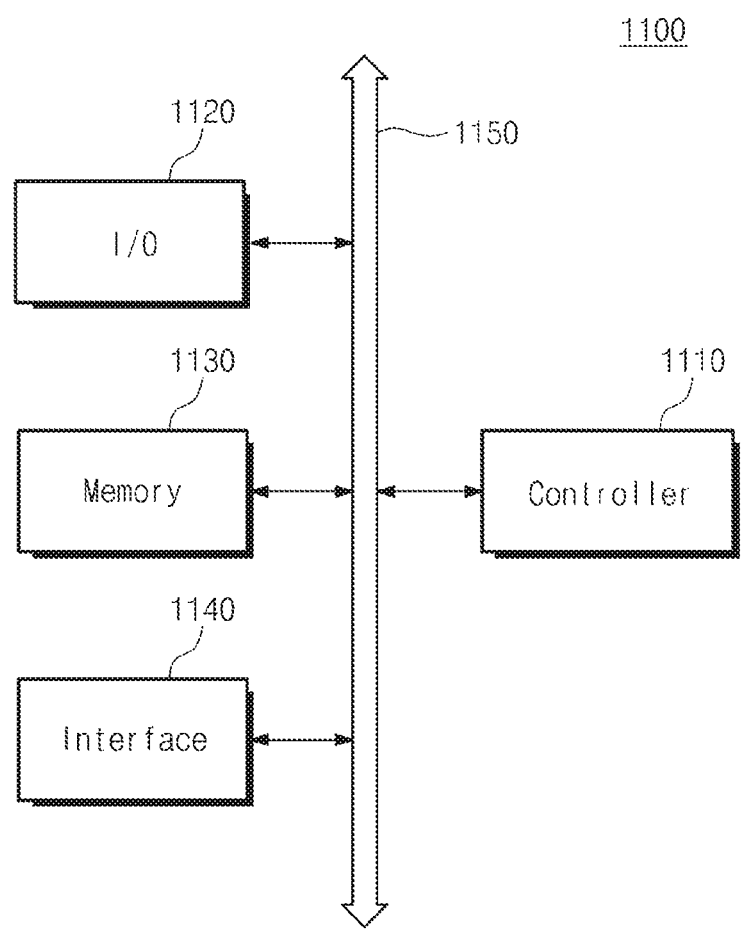
FIG. 11 is a schematic block diagram illustrating an electronic system including a semiconductor device according to example embodiments of inventive concepts.

FIG. 11 is a schematic block diagram illustrating an electronic system including a semiconductor device according to example embodiments of inventive concepts.

Referring to FIG. 11, an electronic system 1100 according to example embodiments of inventive concepts may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the electronic system 1100 may further include a fast dynamic random access memory (DRAM) device and/or a fast SRAM device which acts as a cache memory for improving an operation of the controller 1110. At least one of the semiconductor devices according to the aforementioned example embodiments of inventive concepts may be provided in the memory device 1130 and/or may be provided in the controller 1110 and/or the I/O 1120.

The electronic system 1100 may be applied to a personal digital assistant (PDA), a portable computer, a web tablet, a wireless phone, a mobile phone, a digital music player, a memory card, or other electronic products receiving or transmitting information data by wireless.

Figure 12:
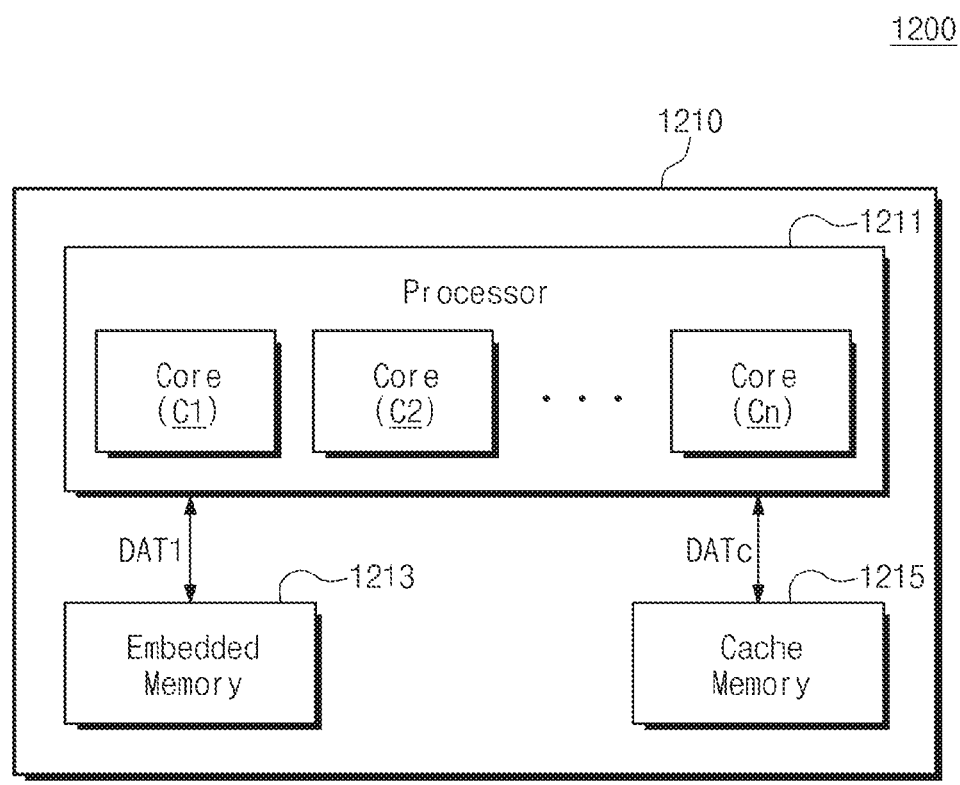
FIG. 12 is a schematic block diagram illustrating an electronic device including a semiconductor device according to example embodiments of inventive concepts.

FIG. 12 is a schematic block diagram illustrating an electronic device including a semiconductor device according to example embodiments of inventive concepts.

Referring to FIG. 12, an electronic device 1200 may include a semiconductor chip 1210. The semiconductor chip 1210 may include a processor 1211, an embedded memory 1213, and a cache memory 1215.

The processor 1211 may include one or more processor cores C1 to Cn. The one or more process cores C1 to Cn may process electrical data and/or electrical signals. The process cores C1 to Cn may include the above-mentioned semiconductor device according to example embodiments of inventive concepts.

The electronic device 1200 may perform a specific function by means of the processed data and signals. For example, the processor 1211 may be an application processor.

The embedded memory 1213 may exchange first data DAT1 with the processor 1211. The first data DAT1 may be data processed or to be processed by the one or more processor cores C1 to Cn. The embedded memory 1213 may manage the first data DAT1. For example, the embedded memory 1213 may buffer the first data DAT1. In other words, the embedded memory 1213 may act as a buffer memory or working memory of the processor 1211.

In example embodiments, the electronic device 1200 may be applied to a wearable electronic device. The wearable electronic device may mainly perform a function requiring a relatively small quantity of operations. Thus, if the electronic device 1200 is applied to the wearable electronic device, the embedded memory 1213 may not need a great buffer capacity.

The embedded memory 1213 may be a SRAM. An operating speed of the SRAM may be faster than that of a DRAM. When the SRAM is embedded in the semiconductor chip 1210, it is possible to realize the electronic device 1200 having a small size and a fast operating speed. In addition, when the SRAM is embedded in the semiconductor chip 1210, consumption of an active power of the electronic device 1200 may be reduced. The SRAM may include the above-mentioned semiconductor device according to example embodiments of inventive concepts.

The cache memory 1215 may be mounted on the semiconductor chip 1210 along with the one or more process cores C1 to Cn. The cache memory 1215 may store cache data DATc. The cache data DATc may be data used by the one or more process cores C1 to Cn. The cache memory 1215 may have a relatively small capacity but may have a very fast operating speed. In example embodiments, the cache memory 1215 may include a SRAM including the semiconductor device according to the above mentioned example embodiments of inventive concepts. When the cache memory 1215 is used, it is possible to reduce an access number and an access time of the processor 1211 accessing the embedded memory 1213. Thus, the operating speed of the electronic device 1200 may be improved when the cache memory 1215 is used.

In FIG. 12, the cache memory 1215 is separated from the processor 1211 for the purpose of ease and convenience in explanation. However, example embodiments are not limited thereto. For example, the cache memory 1215 alternatively may be configured to be included in the processor 1211.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 13:
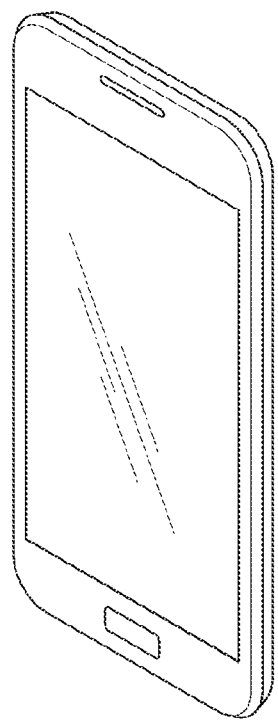
FIG. 13 illustrates a mobile phone to which an electronic system according to example embodiments of inventive concepts.

The electronic system 1100 of FIG. 11 may be applied to electronic control devices of various electronic products. FIG. 13 illustrates a mobile phone 2000 implemented with the electronic system 1100 of FIG. 11. The electronic system 1100 of FIG. 11 may also be applied to a portable notebook, a MP3 player, a navigation device, a solid state disk (SSD), cars, or household appliances.

According to example embodiments of inventive concepts, the fin structure may include the buffer pattern and the active pattern having a different lattice constant from the buffer pattern, so the buffer pattern may provide the tensile or compressive strain to the active pattern. The active pattern may function as the channel of the transistor formed on the fin structure. Since the buffer pattern provides the tensile or compressive strain to the active pattern, it is possible to provide the method for manufacturing the semiconductor device with improved channel characteristics.

In addition, since the gate spacers may be formed on the sidewalls of the sacrificial gate pattern by the ion beam etching process having the specific directivity, it is possible to minimize etch damage of the fin structure disposed at both sides of the sacrificial gate pattern. Thus, the cladding layers may be uniformly grown from the fin structure disposed at both sides of the sacrificial gate pattern, thereby increasing the process margin of the formation process of the cladding layers. As a result, it is possible to provide the methods for forming the semiconductor device which are capable of improving electrical characteristics and of increasing the process margin of the process of forming the cladding layers.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method for manufacturing a semiconductor device, the method comprising:
    forming a fin structure on a substrate, the fin structure extending in a first direction;
    forming a sacrificial gate pattern on the substrate, the sacrificial gate pattern extending in a second direction intersecting the first direction, the sacrificial gate pattern intersecting the fin structure;
    forming a gate spacer layer covering the fin structure and the sacrificial gate pattern;
    providing a first ion beam having a first incident angle range and a second ion beam having a second incident angle range to the substrate,
        the first and second ion beams irradiated at a same time,
        an irradiation direction of the first ion beam and an irradiation direction of second ion beam each being tilted from a normal line perpendicular to a top surface of the substrate,
        the irradiation direction of the first ion beam including a vector component in the second direction, and
        the irradiation direction of the second ion beam including a vector component in a direction opposite the second direction when viewed from a plan view;
    patterning the gate spacer layer using the first ion beam and the second ion beam to form gate spacers on sidewalls of the sacrificial gate pattern;
    forming source/drain regions at both sides of the sacrificial gate patterns; and
    replacing the sacrificial gate pattern with a gate electrode.

2. The method of claim 1, wherein
    each of the first and second incident angle ranges is from 10 degrees to 50 degrees, and
    the first and second incident angle ranges are defined as angle ranges tilted from the normal line.

3. The method of claim 1, wherein the providing the first ion beam and the second ion beam includes:
supplying a source gas over the substrate;
converting the source gas into a plasma by using plasma power; and
applying an ion extraction voltage to the substrate to extract the first ion beam and the second ion beam from the plasma.

4. The method of claim 3, wherein the source gas includes a mixed gas of a fluorine-based etching gas and an oxygen gas.

5. The method of claim 4, wherein the fluorine-based etching gas includes at least one of $CH_3F$, $CF_4$, $C_2F_6$, $SiF_4$, or $NF_3$.

6. The method of claim 5, wherein a partial pressure ratio of the oxygen gas in the source gas ranges from 50% to 80%.

7. The method of claim 3, wherein
the applying the ion extraction voltage includes applying the ion extraction voltage in a pulse form, and
a duty cycle of the ion extraction voltage ranges from 50% to 75%.

8. The method of claim 7, wherein the ion extraction voltage ranges from 200V to 1000V.

9. The method of claim 1, wherein
the fin structure includes a first portion under the sacrificial gate pattern and second portions at both sides of the sacrificial gate pattern,
the gate spacer layer covers top surfaces and sidewalls of the second portions,
patterning the gate spacer layer includes fully removing the gate spacer layer on the top surfaces and the sidewalls of the second portions using the first ion beam and the second ion beam, and
the sidewalls of each of the second portions are opposite to each other in the second direction.

10. The method of claim 9, wherein
the forming the source/drain regions includes performing an epitaxial process to form cladding layers on the second portions,
each of the cladding layers includes a first sidewall negatively inclined to the top surface of the substrate, a second sidewall positively inclined to the top surface of the substrate, and a third sidewall connected to the first and second sidewalls,
one end of the third sidewall adjacent to the substrate is connected to one end of the first sidewall, and
another end of the third sidewall is connected to one end of the second sidewall.

11. The method of claim 10, wherein the forming the source/drain regions further includes doping portions of the second portions with dopants before the cladding layers are formed.

12. A method for manufacturing a semiconductor device, the method comprising:
forming a fin structure on a substrate;
forming a sacrificial gate pattern intersecting the fin structure;
forming a gate spacer layer on the substrate including the sacrificial gate pattern;
etching the gate spacer layer using an ion beam etching process to form gate spacers on sidewalls of the sacrificial gate pattern,
the ion beam etching process being performed using an ion beam having a desired incident angle range,
the ion beam being tilted from a normal line perpendicular to a top surface of the substrate, and
the ion beam being irradiated in substantially parallel to a plane defined by a direction intersecting the fin structure and a direction perpendicular to the top surface of the substrate;
forming cladding layers on the fin structure at both sides of the sacrificial gate pattern; and
replacing the sacrificial gate pattern with a gate electrode.

13. The method of claim 12, wherein
the ion beam includes a first ion beam having a first incident angle range and a second ion beam having a second incident angle range, and
the first ion beam and the second ion beam are symmetrical with respect to the normal line.

14. The method of claim 13, wherein
each of the first and second incident angle ranges is from 10 degrees to 50 degrees, and
the first and second incident angle ranges are defined as angle ranges tilted from the normal line.

15. The method of claim 12, further comprising:
doping portions of the fin structure at both sides of the sacrificial gate pattern with dopants before forming the cladding layers.

16. A method for manufacturing a semiconductor device, the method comprising:
forming a gate spacer layer covering a fin structure and a sacrificial gate pattern on a substrate,
the fin structure extending a first direction,
the sacrificial gate pattern extending a second direction crossing the first direction,
the sacrificial gate pattern crossing over the fin structure;
forming gate spacers on sidewalls of the sacrificial gate pattern by patterning the gate spacer layer using an ion beam etching process,
the ion beam etching process including supplying a source gas over the substrate, converting the source gas into a plasma, applying an ion extraction voltage to the substrate to extract a first ion beam and a second ion beam from the plasma, and directing irradiation directions of the first ion beam and the second ion beam,
the directing the irradiation directions of the first ion beam and the second ion beam including directing the first ion beam and the second ion beam so the first ion beam and the second ion beam along the first direction are directed normal to the substrate,
the directing the irradiation directions of the first ion beam and the second ion beam including directing the first ion beam and the second ion beam such that the first ion beam and the second ion beam along the second direction are directed tilted towards the substrate and tilted towards each other in respective directions that are tilted from a normal line perpendicular to a top surface of the substrate; and
replacing the sacrificial gate pattern with a gate electrode.

17. The method of claim 16, wherein the source gas includes a mixed gas of a fluorine-based etching gas and an oxygen gas.

18. The method of claim 16, wherein the directing the irradiation directions of the first ion beam and the second ion beam includes tilting the first ion beam and the second ion beam along the second direction so the first ion beam and the second ion beam each include an incident angle range from 10 degrees to 50 degrees and the first ion beam and the second ion beam are symmetrical with respect to the normal line.

19. The method of claim 16, further comprising:
forming source/drain regions at both sides of the sacrificial gate patterns.

20. The method of claim 16, wherein
the directing irradiation directions of the first ion beam and the second ion beam includes directing the first ion beam and the second ion beam through an ion beam control unit over the substrate,
the ion beam control unit includes first and second insulators laterally spaced apart from each other in the first direction, and a third insulator at a higher level than the first and second insulators and between the first and second insulators in a plan view, and
the first to third insulators each extend in the second direction.

* * * * *